(12) United States Patent
Molnar

(10) Patent No.: US 6,393,266 B1
(45) Date of Patent: May 21, 2002

(54) PREPROCESSOR AND RELATED FREQUENCY TRANSLATOR

(75) Inventor: Alyosha C. Molnar, Costa Mesa, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/261,056

(22) Filed: Mar. 2, 1999

(51) Int. Cl.[7] .................................................. H04B 1/26
(52) U.S. Cl. ........................................ 455/323; 455/310
(58) Field of Search ................................... 455/324, 313, 455/323, 326, 330, 333, 304, 310

(56) References Cited

U.S. PATENT DOCUMENTS 5,574,755 A    11/1996    Persico ........................ 375/295

FOREIGN PATENT DOCUMENTS

WO    WO 96/38924    5/1996

OTHER PUBLICATIONS

Ian Doyle, "A Simplified Subharmonic I/Q Modulator", *Applied Microwave & Wireless*, Oct. 1998.
Takafumi Yamaji et al., "An I/Q Active Balanced harmonic Mixer with IM2 Cancelers and a 45° Phase Shifter", *IEEE Journal of Solid–State Circuits*, vol. 33, No. 12, Dec. 1998.

Primary Examiner—Vivan Chang
Assistant Examiner—N. Mehrpour
(74) Attorney, Agent, or Firm—Howrey Simon Arnold & White LLP

(57) ABSTRACT

A direct conversion receiver comprising a preprocessor coupled to a frequency translator which, in one implementation, is a modified Gilbert mixer. In one embodiment, the preprocessor imparts desired characteristics to split-phase signals received from a local oscillator, including transition points which are determined by crossings through a DC offset, substantial symmetry about a DC offset, and steep transitions about the transition points. In one embodiment, the period of the signals from the local oscillator is divided into portions, and only one of the output signals from the preprocessor is asserted in a predefined state at a time, the predefined state determined effective to reverse polarity of the mixer, signals and a related frequency translator which is responsive to the signals. The frequency translator has a first input at a first input frequency, and at least one second input at a second frequency. In one embodiment, the first signal is an RF signal and the second frequency is about 1/n times the RF frequency, wherein n is an integer. The frequency translator is configured to reverse polarity at a rate which is n times the second frequency.

25 Claims, 29 Drawing Sheets

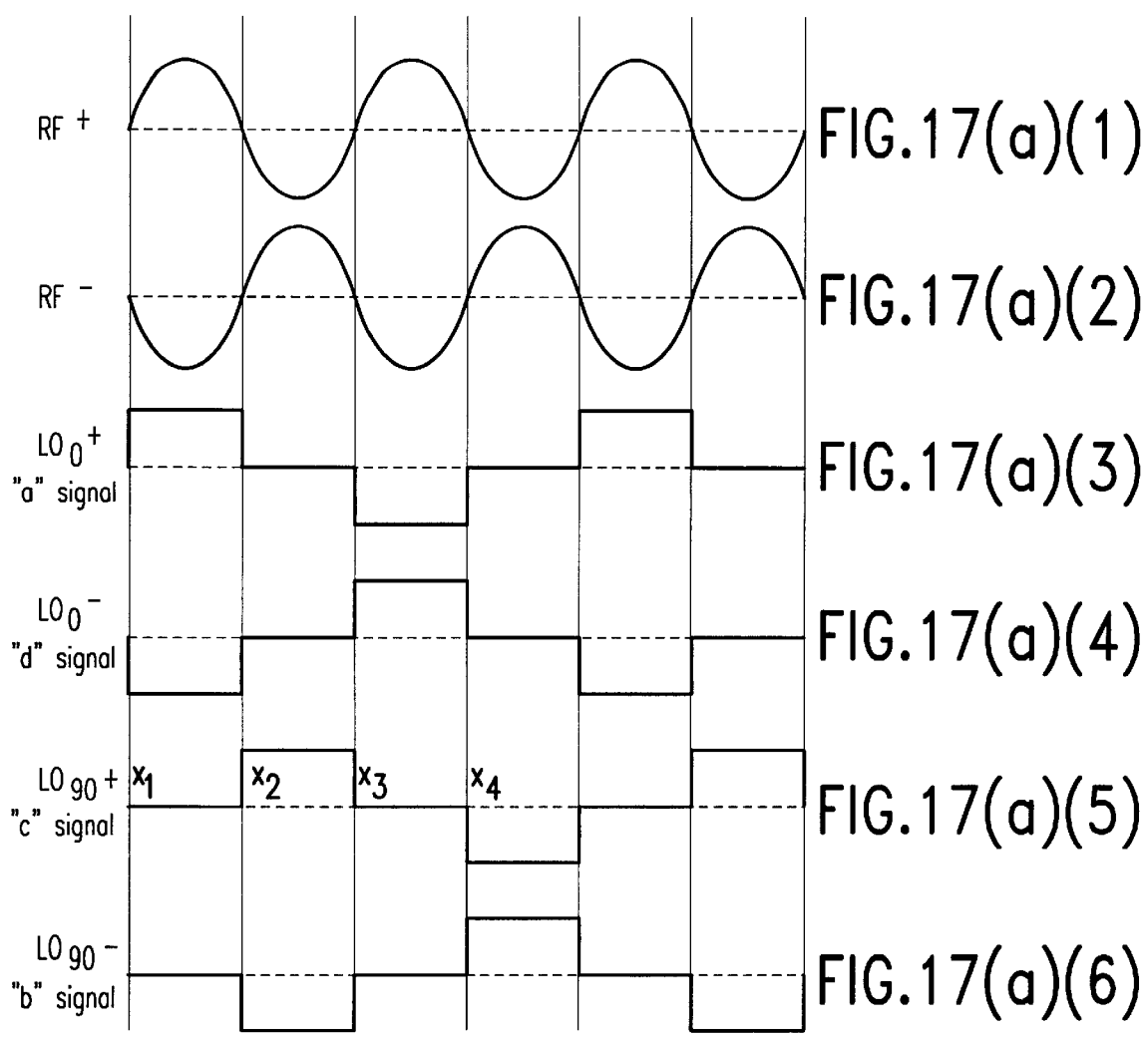

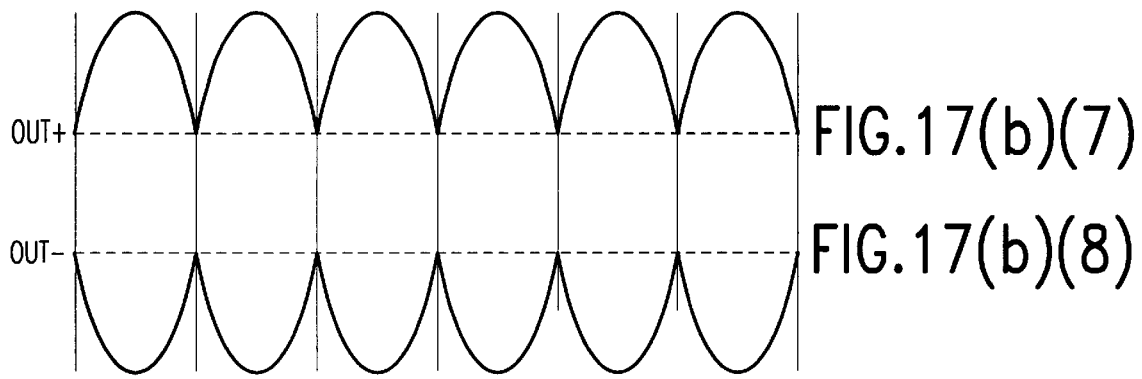

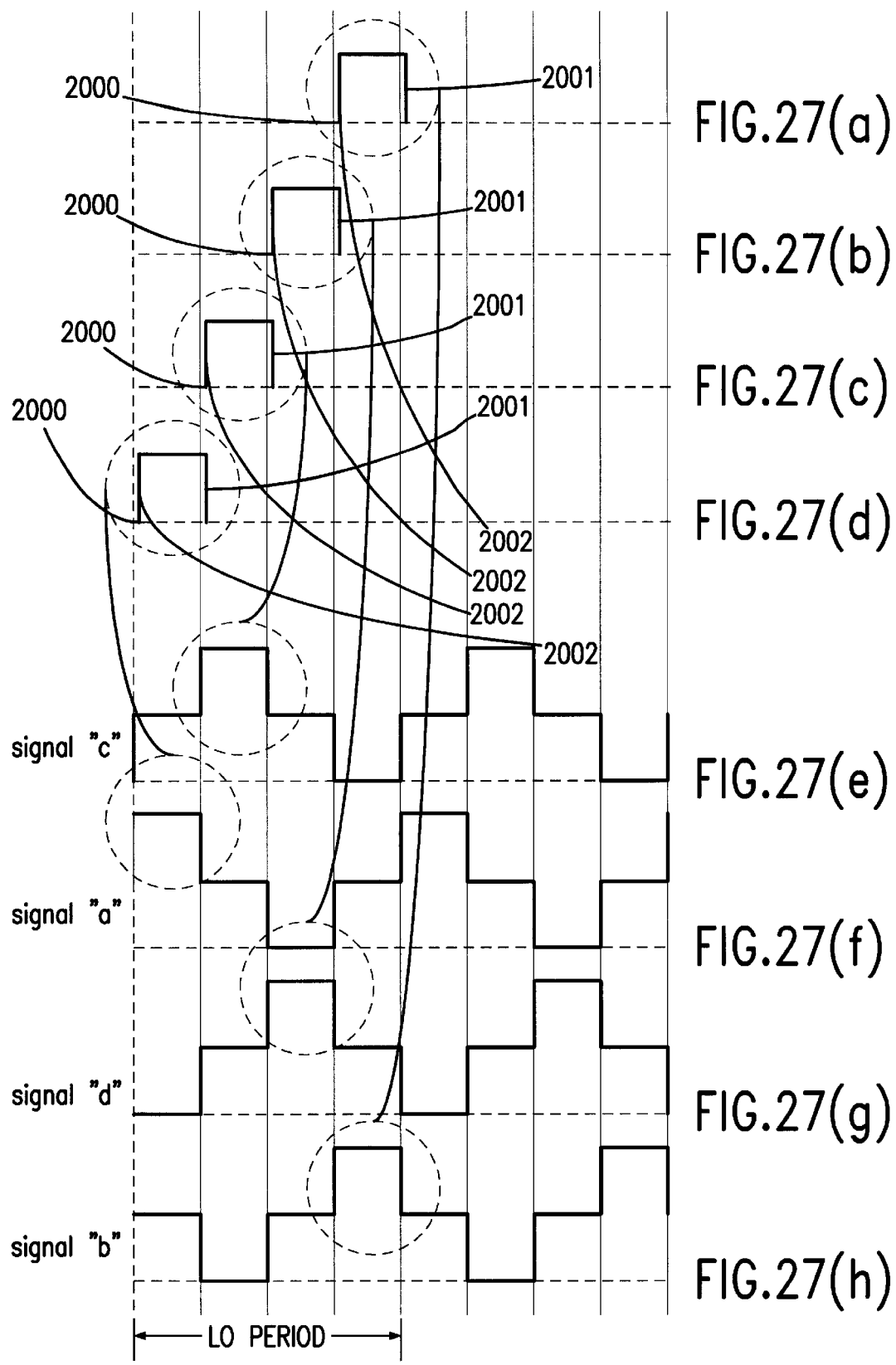

PREPROCESSOR AND RELATED FREQUENCY TRANSLATOR

BACKGROUND OF THE INVENTION

1. Field of the Invention

The field of the invention relates generally to wireless communication receivers, and more specifically to a preprocessing system for frequency translator applications and a related frequency translator which together form the core of a direct conversion receiver.

2. Background

Modern electronic communications systems increase the speed, accuracy, ease, expense, and efficiency of transmitting voice, video and data information. One example of a modern electronic communication system is a wireless communication system designed to transmit information over a wireless communication channel using high frequency carrier signals, most often at radio frequency.

One ongoing trend in wireless communication systems is a reduction in size, power consumption and cost of the wireless handsets. For example, since 1992, handsets operating under the GSM (Global System for Mobile Communication) standard have undergone a transition in handset volume (size) from 500 cc to 150 cc and a reduction in weight from 500 grams to 200 grams. In the same period of time, the user's price for a handset operating under the GSM standard has fallen more than 70%.

In the personal wireless communication arena, these reductions in size, weight, and cost are offered to prospective consumers as incentives to purchase a particular brand of phone or type of service. Hence, the manufacturers and service providers with the smallest, lightest and least expensive phones enjoy the best opportunity for marked increases in sales, subscribers and profits. Thus, the trend towards miniaturization and cost efficiency continues.

FIG. 1 illustrates the front end of a modern wireless communication receiver as might be found in handsets of the prior art. One aspect of the receiver performs the task of de-modulation, that is, down conversion of the channel from the carrier frequency ($F_{RF}$), so that the base band signal, at frequency $F_{bb}$, may be provided to a listener or data processing device.

Wireless handsets include an antenna (not shown) designed to capture radio signals. Connected to the output of the antenna is a RF (radio frequency) input 200 that in turn connects to a first frequency translator 202, which in one implementation, is a mixer.

A local oscillator 204 also connects to the first frequency translator 202 to provide a mixing signal. In systems of the prior art, the local oscillator frequency is set at $F_x$ to obtain a desired output from the first frequency translator 202.

The first frequency translator 202 multiples the RF signal with the local oscillator signal in a process described below in greater detail to yield a signal on a line 206 at a frequency $F_1$ which is intermediate, that is, between the carrier frequency and base band.

Filter and amplifier system 208 connects to the output of the first frequency translator 202 to filter unwanted blocking signals and amplify the received signal for further processing.

A second frequency translator 210 connects to the output of filter amplifier system 208 to further reduce the frequency of the received signal and thereby isolate the base band signal. A second local oscillator 212 connects to the second frequency translator 210. An output line 214 carries the demodulated signal at base band frequency $F_{bb}$.

Local oscillators of the prior art such as local oscillators 204, 212 generally output two signals both of which generally resemble a sine wave but are 180 degrees out of phase with respect to each other. FIG. 2 illustrates the 180° degree phase shift relationship between the two signals. Of importance is the transition where the value of a first signal 216 becomes greater than or less than the value of a second signal 218. These transitions define points at which one implementation of frequency translators 202 and 214 switch polarity. For two signals 180° degrees out of phase, these transitions occur at points such as 219.

In the receiver of FIG. 2, the filter and amplifier systems 208 require off chip space and resources, consume valuable power, and add weight and expense to the demodulating circuitry. In addition, the use of two frequency translators, mixers 202 and 210, is redundant and expensive.

Therefore, a need exists for a receiver design that reduces the expense, size, weight, complexity, and power consumption of prior art receivers.

Other objects and advantages are set forth in the description that follows, or will be apparent to those of ordinary skill in the art.

3. Related Applications

This application is related to a co-pending patent application Ser. No. 09/260,919 entitled "DIRECT CONVERSION RECEIVER", which is owned in common by the assignee hereof, and is being filed on even date herewith. This application is hereby fully incorporated by reference herein as though set forth in full.

SUMMARY OF THE INVENTION

In accordance with the purpose of the invention as broadly described herein, there is provided a direct conversion receiver system which includes a preprocessor and frequency translator. In one embodiment, the preprocessor receives a plurality of split-phase signals from a local oscillator, and, responsive thereto, outputs a plurality signals having preferred characteristics to improve the switching action in the frequency translator and to reduce the effects of leakage between the inputs of the frequency translator. The frequency translator is configured to operate in conjunction with the preprocessor. In one implementation, the frequency translator is a modified Gilbert mixer configured to switch polarity at twice the local oscillator frequency. In this implementation, the preprocessor is configured to provide signals to the local oscillator (LO) inputs of the mixer which are at ½ of the radio frequency (RF) carrier frequency.

A first aspect of the invention comprises the receiver system. A second aspect comprises the preprocessor. A third aspect comprises the frequency translator. It is contemplated that the invention comprises the foregoing aspects, singly or in combination.

In one embodiment, the preprocessor connects to the output of a phase-split local oscillator and is coupled to the input of a mixer or similar frequency translation device. In this embodiment, the output of the preprocessor is provided to the input of the mixer at a frequency which is about ½ the frequency of the received signal. This signal is multiplied with the received radio signal to downconvert the channel, and recover the baseband signal. The significant improvement in the switching of the mixer provided by the preprocessor allows the ½ LO mixer to be commercially viable.

The output of the preprocessor in one embodiment comprises a plurality of phase-shifted signals. In one implementation, the signals are phase-shifted versions of each others, and are substantially symmetrical about a DC offset. In addition, only one of the plurality of output signals is in a predefined state at a time, the predefined state being such as to actuate the switching action in the mixer. Finally, it is generally preferred that each signal have steep or rapid transitions at the points which define the transition points of the mixer.

In one embodiment, the preprocessor comprises a first and second comparator, each configured to receive two input signals from a four output local oscillator. The comparators compare the values of the two signals relative to one another, and provide as an output a positive or negative value based upon which signal input is greater. In one embodiment, the comparators comprise two output comparators while, in another embodiment, the comparators are single output comparators.

The output of the comparators connects to a summing junction or summing unit wherein the signals are added or subtracted in various combinations to achieve a desired plurality of output signals. One embodiment also includes a buffer circuit connected to the preprocessor output for impedance transformation.

In one embodiment, the input to the preprocessor comprises four 90 degree phase-split sinusoidal signals of substantially equal amplitude which are output from a local oscillator. The sinusoidal signals are then processed to provide four 90 degree phase-split output signals having improved switching characteristics, only once of which is in the predefined state at a time. In this embodiment, the following principles control which output signal is in the predefined state at a time:

1. If the first local oscillator output is greater than the second local oscillator output and the third local oscillator output is greater than the fourth local oscillator output, then place the first preprocessor output in the predefined state.

2. If the first local oscillator output is less than the second local oscillator output and the third local oscillator output is greater than the fourth local oscillator output, then place the third preprocessor output in the predefined state.

3. If the first local oscillator output is less than the second local oscillator output and the third local oscillator output is less than the fourth local oscillator output, then place the fourth preprocessor output in the predefined state.

4. If the first local oscillator output is greater than the second local oscillator output and the third local oscillator output is less than the fourth local oscillator output, then place the second preprocessor output in the predefined state.

Another aspect of the subject invention is a frequency translator configured to operate in conjunction with the foregoing preprocessor. In one embodiment, the frequency translator is a mixer having local oscillator (LO) and radio frequency (RF) inputs. The outputs of the preprocessor are coupled to the LO inputs of the mixer. The frequency of the LO inputs is about ½ that of the RF input. The mixer is configured to mix the RF and LO inputs utilizing a switching action which is about twice the rate of the LO frequency. The output of the mixer includes a baseband component and a higher frequency component. The higher frequency component can be filtered out using a suitable low pass filter. The result is a baseband signal which is directly down converted from the RF signal.

In one embodiment, the inputs and outputs of the mixer are differential inputs. This aspect, coupled with the symmetry of the preprocessor outputs, reduces to an acceptable level the effects of the LO inputs leaking onto the RF inputs of the mixer. As to leakage from the RF input port to the LO input port, the effects of such leakage are eliminated by the operation of the preprocessor in a manner to be discussed in the body of this disclosure.

The net result of the foregoing is that a direct conversion receiver is now possible for applications such as wireless handsets, with the core portion of the receiver comprising the foregoing preprocessor and mixer combination.

The subject invention may be realized using configurations and methods of operation other than those just described. Further features and advantages of the invention, as well as the structure and operation of particular embodiments of the invention, are described in detail below with reference to the accompanying drawings.

BRIEF DESCRIPTION OF THE DRAWINGS

FIGS. 17(a)–17(b) illustrate exemplary waveforms for one embodiment of a multiplier of the invention.

FIGS. 27(a)–27(h) illustrate desirable characteristics of the preprocessor outputs in one embodiment of the subject invention.

DETAILED DESCRIPTION OF THE PREFERRED EMBODIMENTS

1. Overview of the Invention

A first aspect of the present invention is directed to a direct conversion receiver system suitable for applications such as mobile wireless handsets. The core of the receiver system is a preprocessor and frequency translator. The preprocessor preprocesses the input signals from the local oscillator to improve switching performance of the frequency translator and to reduce the effects of leakage between the inputs of the frequency translator. The inputs to the frequency translator from the preprocessor are at 1/n times the frequency of the other input to the frequency translator, typically the RF input, wherein n is an integer. The frequency translator is configured to switch polarity at n times the frequency of the inputs from the preprocessor.

A second aspect of the invention is the preprocessor, and related method of operation. In one implementation, the preprocessor receives four sinusoidal 90 degrees split-phase signals. The preprocessor processes these signals to provide output signals having rapid transitions at desired transition points which, in one implementation, are the points which define the switching points of a mixer used in combination with the preprocessor. In one implementation, the transition points are defined by zero crossover points of the signals. In addition, the output signals are generally symmetric about a DC offset. In one embodiment, the output signals are such that only one is in a predefined state at a time. In one application, the predefined state is determined to be a state which actuates a switching action or equivalently a reversal of polarity in a mixer used in conjunction with the preprocessor.

A third aspect of the present invention is the frequency translator which, in combination with the foregoing preprocessor, forms the core of the direct conversion receiver that can be used in applications such as mobile wireless handsets. In one implementation, the frequency translator is a modified Gilbert mixer.

It is contemplated that the subject invention includes the foregoing aspects, singly or in combination.

2. Example Environment

Although other applications are possible, one example environment in which the invention can be implemented is a direct conversion receiver in a mobile wireless phone. The core portion of the receiver is formed from the preprocessor and frequency translator combination of the subject invention. The preprocessor is coupled between a local oscillator and the frequency translator. Hence, the output of the local oscillator connects to the input of the preprocessor, while the output of the preprocessor is coupled to the local oscillator input of the frequency translator.

Figure 23:
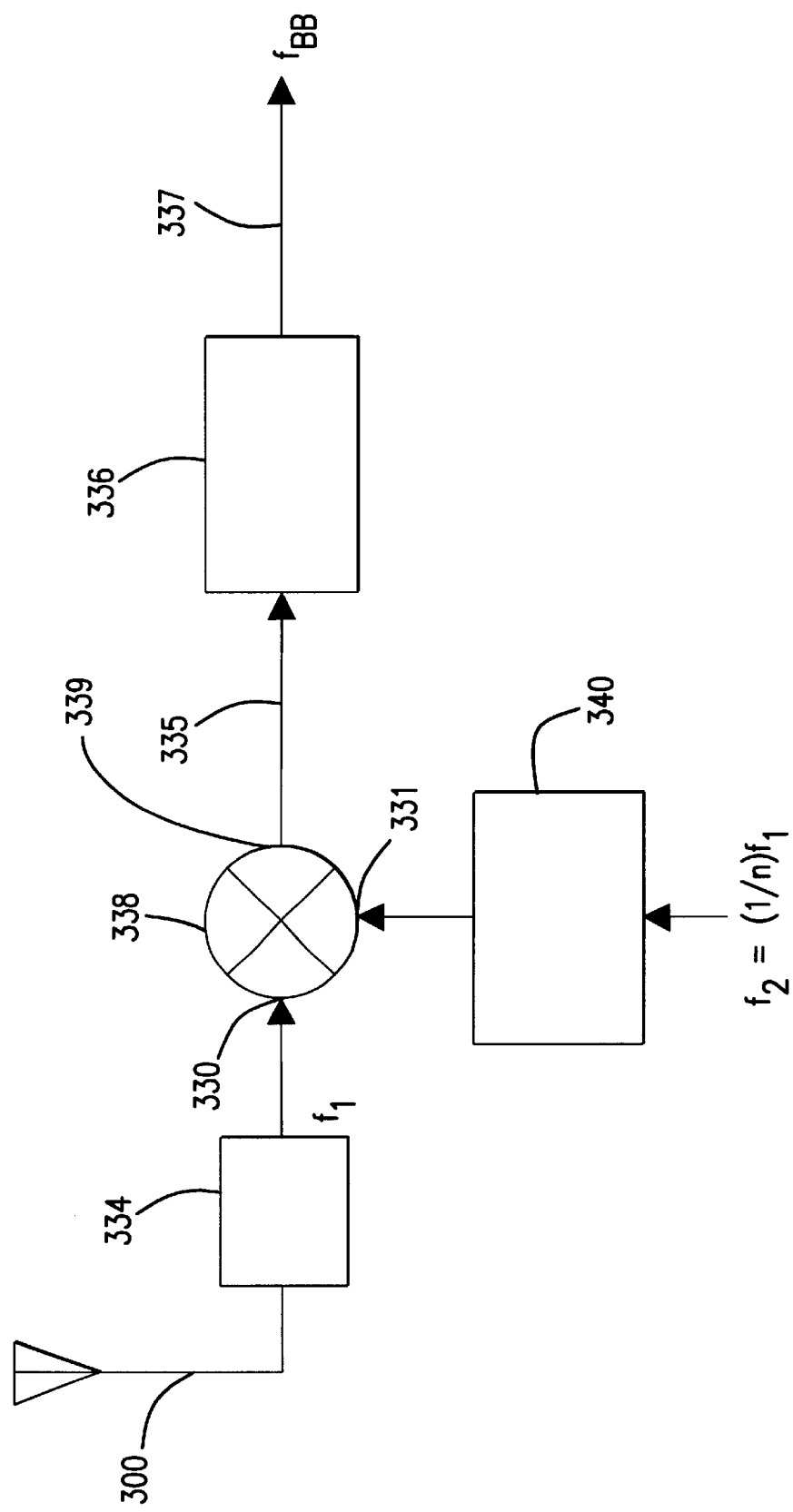
FIG. 23 illustrates a direct conversion receiver in accordance with the subject invention.

A first embodiment of a direct conversion receiver system in accordance with the subject invention is illustrated in FIG. 23. As shown, the system comprises antenna 300 coupled to processing circuitry 334. The antenna is configured to receive a first signal at a first frequency. In one implementation, the first signal is a baseband signal modulated onto an RF carrier. The processing circuitry 334 is configured to perform certain standard processing operations on the incoming signal, including bandlimiting the incoming signal so that it is within a predetermined frequency range. In one implementation, the processing circuitry includes a bandpass filter to perform this bandlimiting task. These processing steps are known to those of skill in the art, and need not be explained further.

Also included in the first embodiment of the receiver system is a multiplier 338 having a first input port 330, a second input port 331, and an output port 339. In this embodiment, the multiplier functions as and can be characterized as a frequency translator. The first input port 330 is configured to receive the output of the processing circuitry 334 at the frequency $f_1$. In one implementation, the multiplier is a mixer, and the first input port is a RF input port. The second input port is configured to receive at least one second signal at a second frequency $f_2$ from preprocessor 340, which in turn is configured to receive a signal from an oscillator circuit (not shown). In one implementation, the second input port is a LO input port, the oscillator circuit is a local oscillator circuit, and the second signal is the output of a preprocessor in accordance with the subject invention. The preprocessor in turn is driven by at least one LO signal generated by the local oscillator circuit.

The oscillator circuit is configured to drive the processor at the second frequency $f_2$ which bears a relationship with the first frequency $f_1$. More specifically, according to this relationship, the first frequency $f_1$ is about an integral multiple of the second frequency $f_2$ such that $f_1=nf_1$ wherein n is an integer. In one implementation, n is 2, such that the second frequency is about ½ of the first frequency. In one implementation example, the second frequency is the LO frequency, the first frequency is the RF frequency, and n is 2 such that the LO frequency is about ½ of the RF frequency. This implementation example utilizes what is known as half-frequency injection.

In this implementation example, it is important to distinguish between the RF frequency, $f_{RF}$, and the RF carrier frequency, $f_x$. The RF frequency signal comprises a baseband signal modulated onto the RF carrier frequency. In this implementation example, the LO frequency is about ½ the RF frequency, and is ½ the RF carrier frequency.

3. The Multiplier of the Subject Invention

Multiplier 338 is configured to multiply the first and second signals respectively appearing at the first and second input ports 330 and 331, and to provide the multiplied signal to output port 339.

Figure 19A:
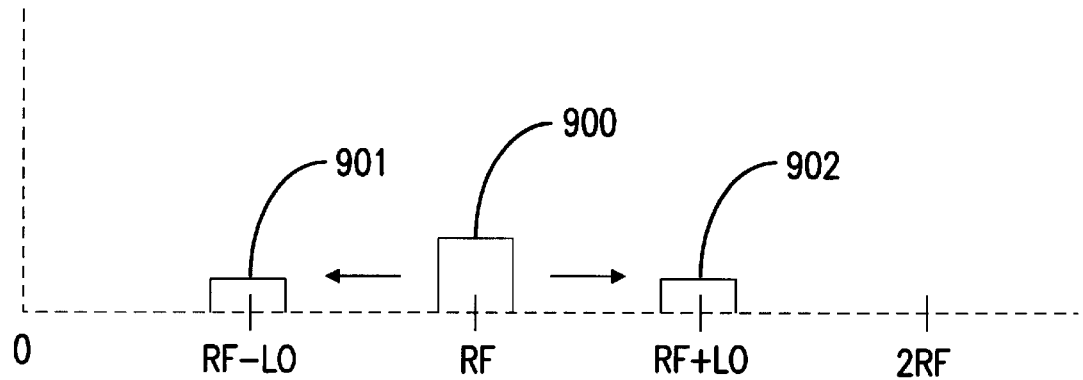
FIGS. 19(a)–19(b) illustrate operation of one embodiment of a multiplier of the subject invention in the frequency domain.
Figure 19B:
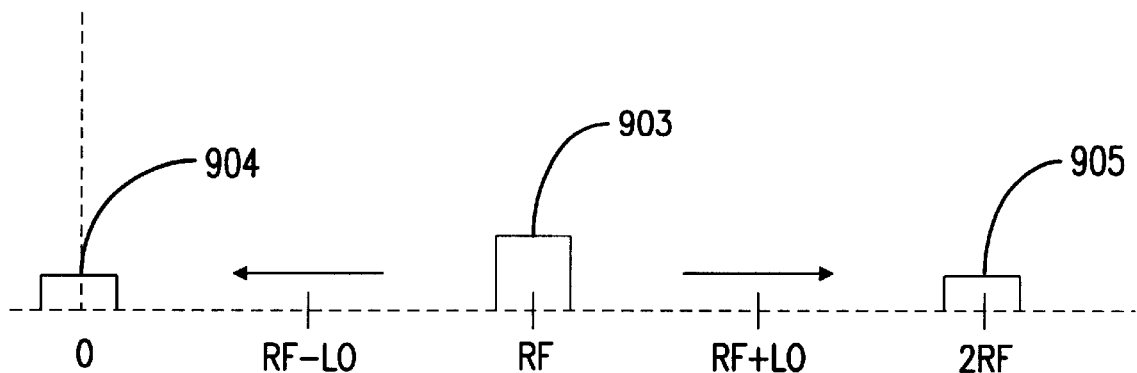

Multiplier 338 is configured to multiply the first and second signals with a switching action which is n times the rate of frequency $f_2$ such that the baseband component at the output of the multiplier is a first order component of the output. This aspect of the multiplier can be explained further with reference to FIGS. 19(a)–(b). With reference to FIG. 19(a), this figure illustrates the operation in the frequency domain of a conventional multiplier in which the first and second input ports are respectively RF and LO input ports, and the frequency of the LO input thereof is about ½ that of the RF input, and the switching action in the multiplier is maintained at the LO frequency. The incoming RF signal, identified with numeral 900, is split into two first order output components, each having ½ the energy of the incoming RF signal. The first component, identified with numeral 901, is at a frequency equal to the LO frequency, or ½ the RF frequency. The second component, identified with numeral 902, is at a frequency equal to three times the LO frequency, or 3⁄2 the RF frequency. This can be seen from the following mathematical identity:

$$(A \cos 2\pi f_{RF} t) \times (B \cos 2\pi f_{LO} t) = \tfrac{1}{2} AB[\cos 2\pi (f_{RF} - f_{LO})] + \tfrac{1}{2} AB[\cos 2\pi (f_{RF} + f_{LO}) t]$$

The first of the foregoing components is at the frequency ½$f_{RF}$ or $f_{LO}$, while the second of the foregoing components is at the frequency 3⁄2$f_{RF}$ or $3f_{LO}$. As can be seen, there are no first order components at baseband frequencies.

With reference to FIG. 19(*b*), this figure illustrates the operation in the frequency domain of a multiplier configured to provide a switching action at a rate equal to twice the LO frequency in accordance with one embodiment of the subject invention. The incoming RF signal, which is identified with numeral 903, is split into two first order output components, identified with numerals 904 and 905. The first component, identified with numeral 904, is at baseband frequencies, and the second component, identified with numeral 905, is at twice the RF frequency, or $2f_{RF}$. As can be seen, a first order component at baseband frequencies is provided in the multiplier of FIG. 19(*b*), but not in the multiplier of FIG. 19(*a*).

Figure 15:
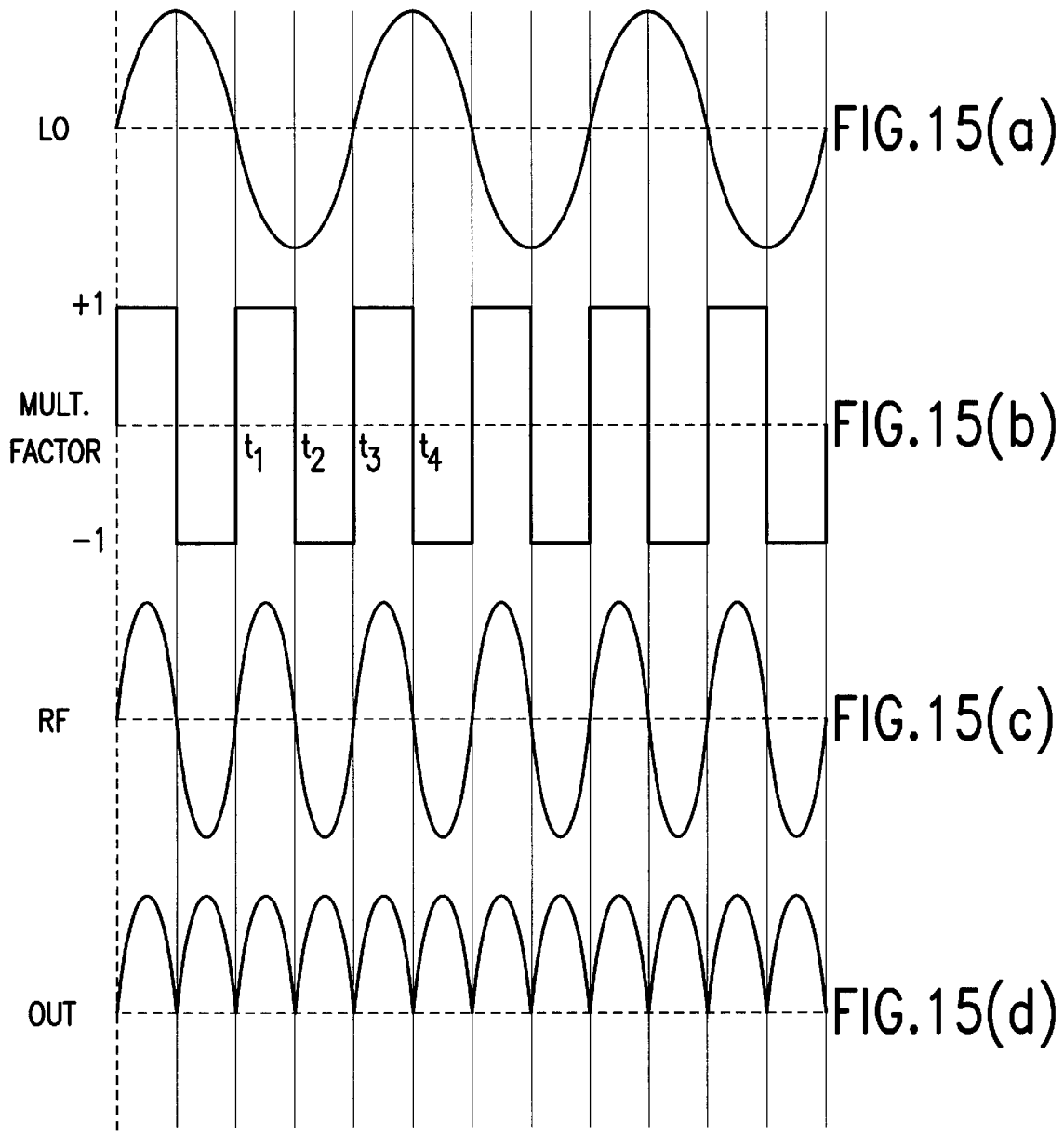
FIGS. 15(a)–15(d) illustrate exemplary waveforms for one embodiment of a frequency translator of the invention.

The operation in the time domain of a multiplier configured in accordance with one embodiment of the subject invention can be explained further with reference to FIGS. 15(*a*)–(*d*). FIG. 15(*a*) is an example of one of a plurality of phase-split LO signals applied to the second input of the multiplier, and FIG. 15(*c*) is an example of a RF signal applied to the first input of the multiplier. As can be seen, the frequency of the LO signal is ½ that of the RF signal.

FIG. 15(*b*) is a multiplication factor which defines the transfer function between the incoming RF signal of FIG. 15(*c*) and the output signal, illustrated in FIG. 15(*d*). As can be seen, the frequency of the switching action of the multiplication factor is twice that of the LO frequency. The product of the multiplication factor and the RF signal defines the output signal of FIG. 15(*d*).

Figure 16:
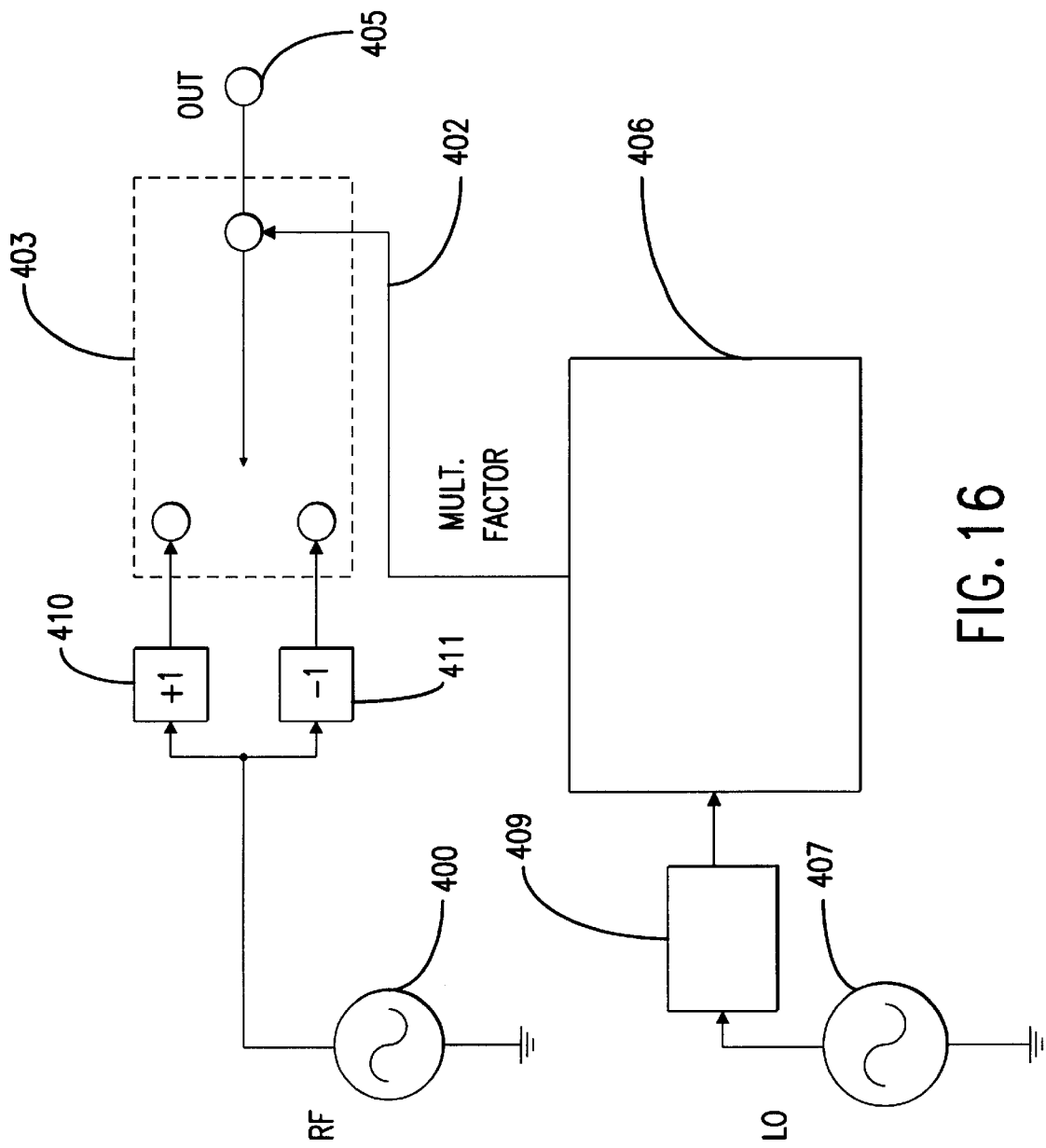
FIG. 16 is a block diagram of a multiplier in accordance with one embodiment of the invention.

FIG. 16 illustrates a block diagram of one embodiment of a multiplier in accordance with the subject invention. In this embodiment, LO source 407 is coupled to preprocessor 409, and the output of preprocessor 409 is input to circuit block 406, which controls DTSP switch 403 through signal line 402 in accordance with a multiplication factor which, in one implementation, switches between +1 and −1 at a rate which is twice the LO frequency. RF source 400 is coupled to +1 multiplication block 410 and −1 multiplication block 411. Switch 403 is configured such that, when the multiplication factor is at +1, the output of multiplication block 410 is provided to the output 405, and when the multiplication factor is −1, the output of multiplication block 411 is provided to the output 405. Consequently, a signal is produced at output 405 which is representative of the product of the multiplication factor and the RF signal.

Preferably, the multiplication factor is not actually produced as a signal at a pin or node of the multiplier. As one of skill in the art would appreciate, it would be counterproductive to actually produce such a signal on a pin or node of the multiplier since the objective of this embodiment is to provide a signal at the LO input port which is about ½ the RF frequency, and production of a signal at a pin or node at twice the LO frequency would defeat that objective. Instead, in this embodiment, the multiplication factor simply represents (1) a switching action which occurs at twice the LO frequency; and (2) the transfer function between the incoming RF signal and the output signal.

Figure 20:
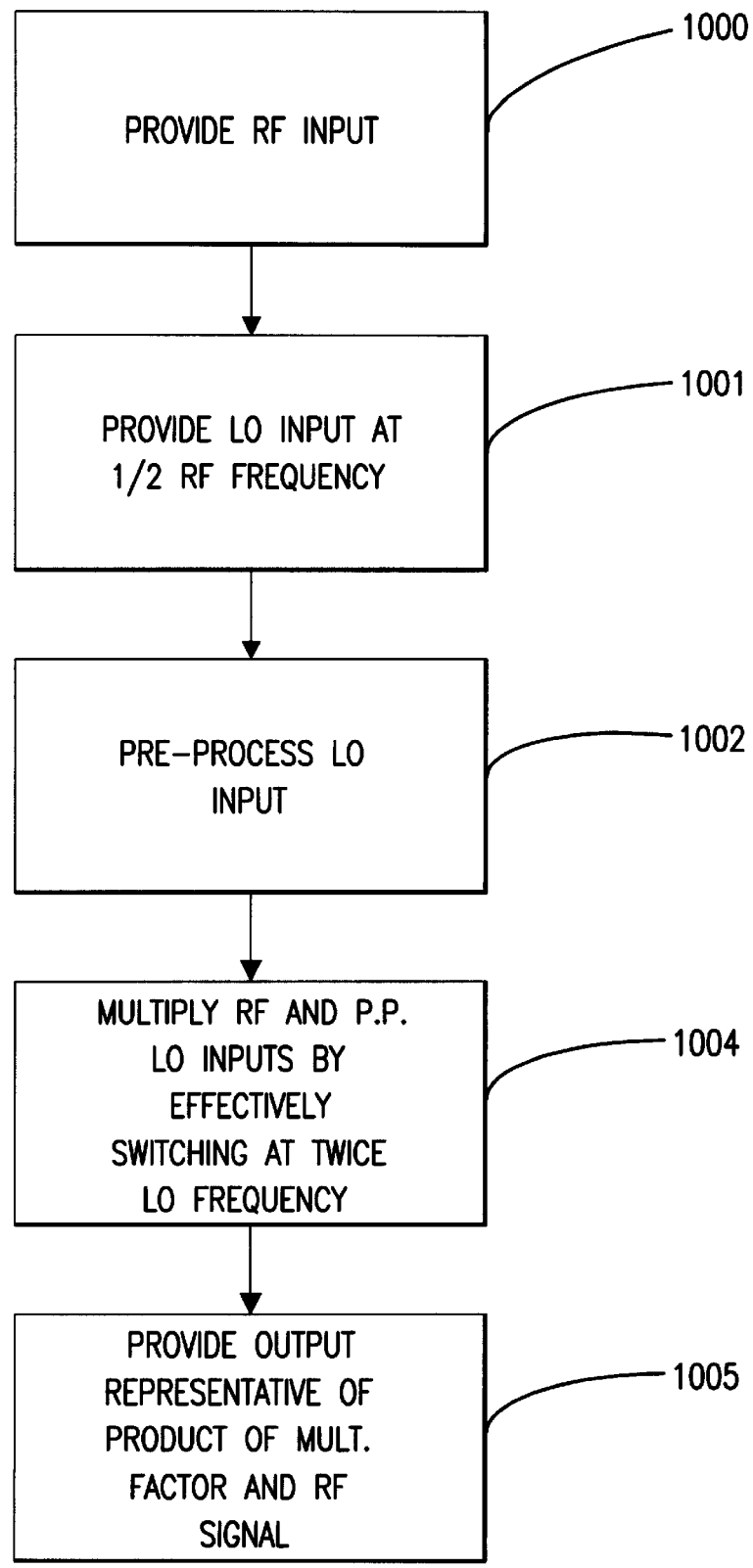
FIG. 20 is a flowchart of one embodiment of a method of operation of the subject invention.

A method of operation of this embodiment of the multiplier is illustrated in FIG. 20. As illustrated, in step 1000, an RF input is provided, and in step 1001, an LO input is provided at a frequency which is about ½ of the RF frequency. In step 1002, the LO signal is preprocessed in accordance with the subject invention. In step 1004, the RF and preprocessed LO inputs are multiplied by effectively switching at twice the LO frequency. In step 1005, an output signal is determined which is representative of the product of a multiplication factor which switches at twice the LO frequency and the RF signal.

As discussed previously, the multiplication factor does not represent an actual signal determined by the multiplier of the subject invention. Instead, it represents the switching action which occurs within the multiplier and also represents the transfer function between the incoming RF signal and the output signal.

Figure 21:
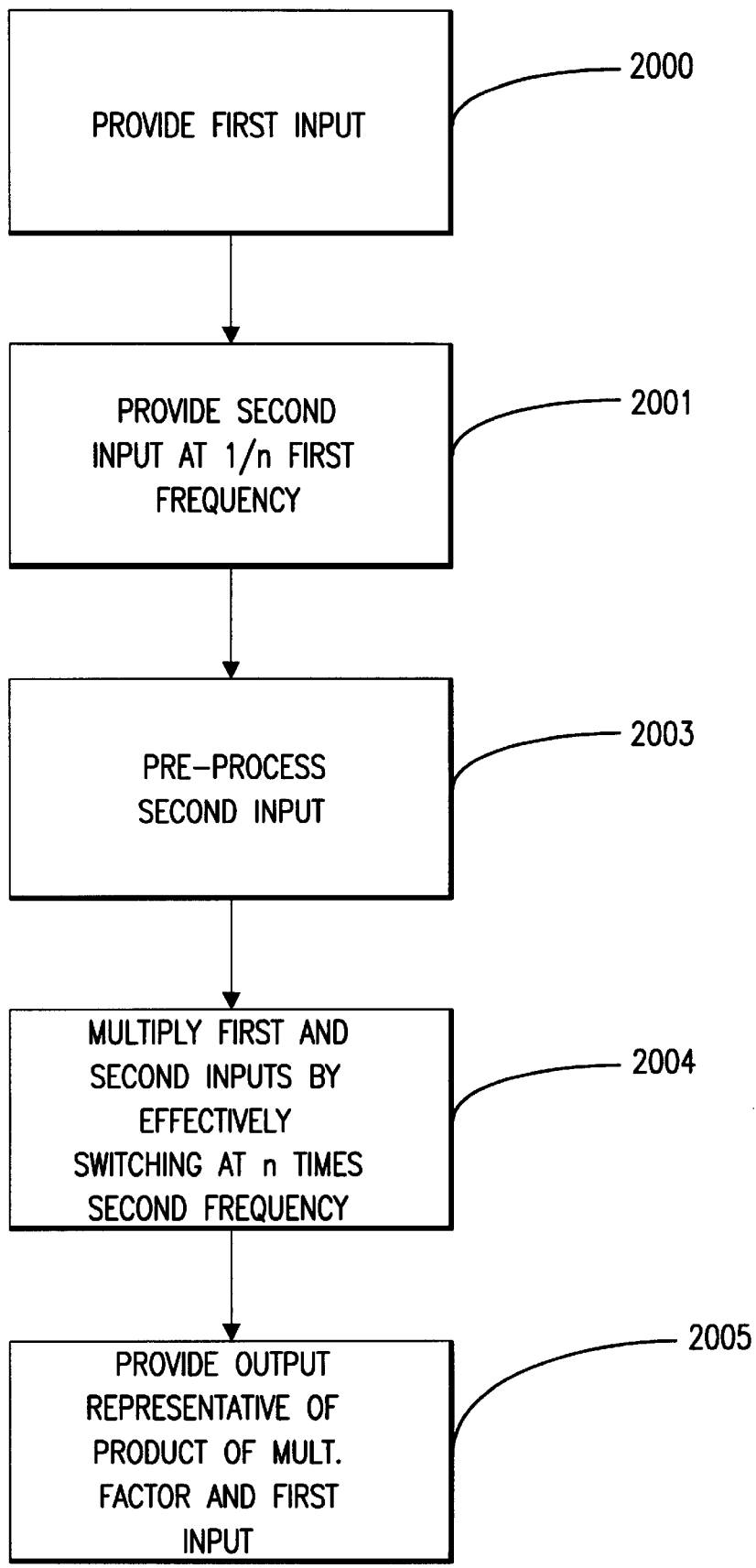
FIG. 21 is a flowchart of a second embodiment of a method of operation of the subject invention.

A method of operation of the embodiment of the subject invention of FIG. 23 is illustrated in FIG. 21. As indicated, in step 2000, a first input signal is provided at a first frequency, and in step 2001, a second input signal is provided at a second frequency which is about 1/n times the frequency of the first input signal, where n is an integer. In step 2003, the second input signal is preprocessed in accordance with the subject invention.

In step 2004, the first signal and the preprocessed second signal are multiplied together while a switching action is effectively performed at n times the second frequency. In step 2005, an output is determined which is representative of the product of a multiplication factor which switches at n times the second frequency and the first signal.

Figure 18A:
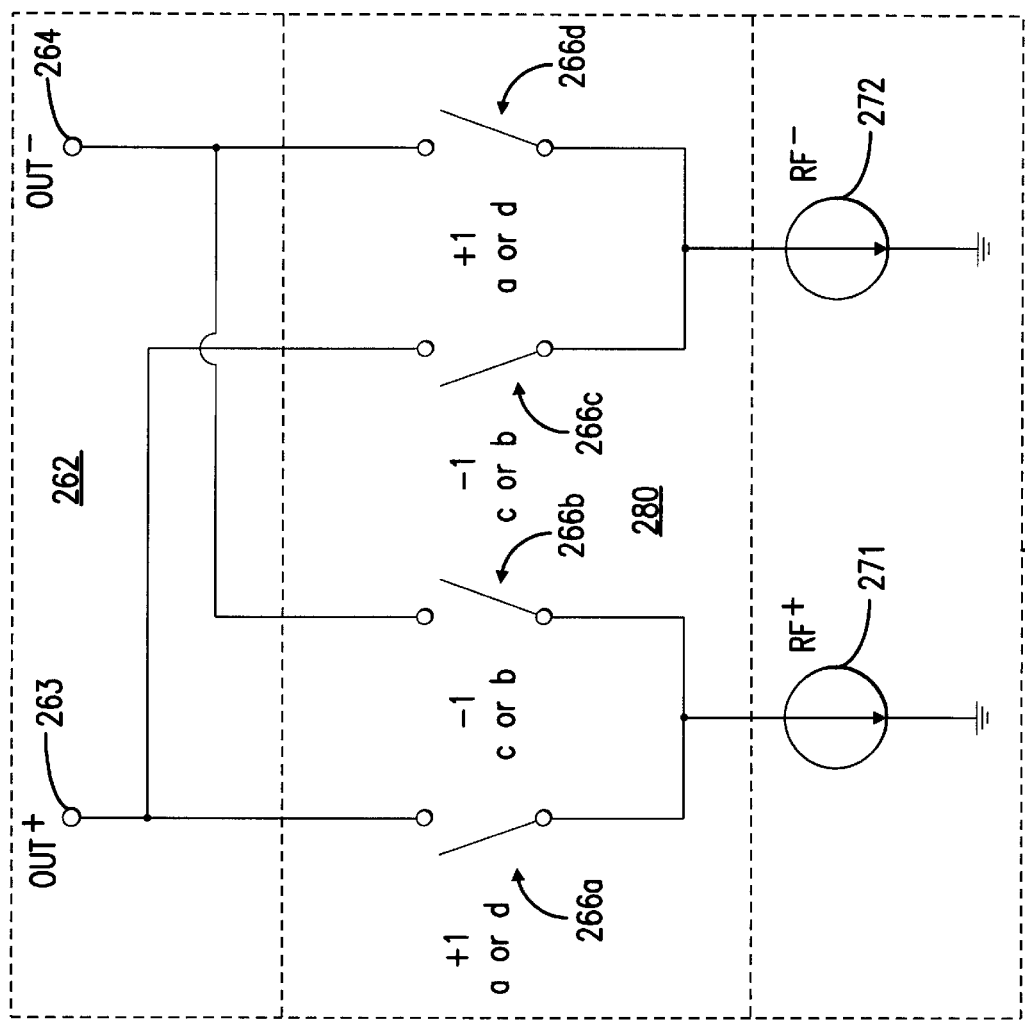
FIGS. 18(a)–18(b) are a block diagram of one implementation of a mixer and related waveform in accordance with the invention.
Figure 18B:
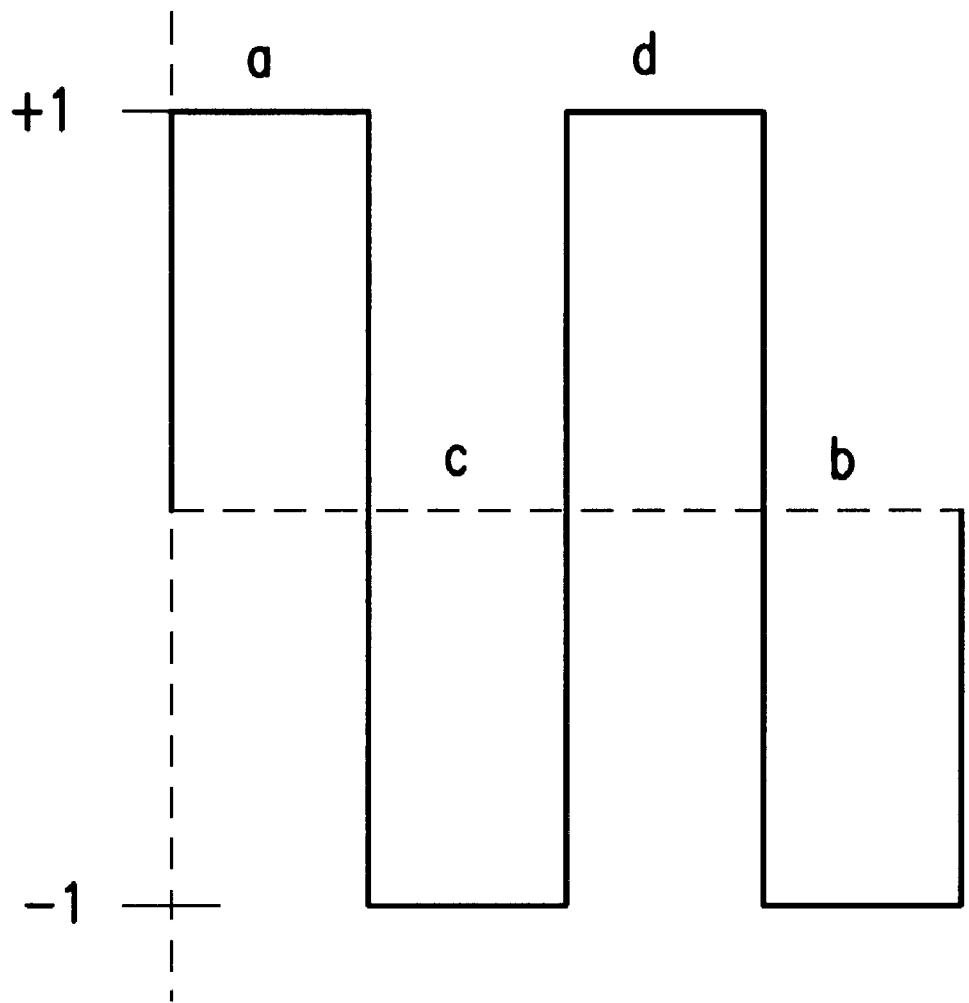

An embodiment of the subject invention which involves differential inputs and outputs will now be described. In this embodiment, the multiplier is a mixer. FIG. 18(*a*) illustrates a block diagram of a mixer in accordance with this embodiment of the invention. A differential RF current source, RF⁺ and RF⁻, is identified with numeral 270, with RF⁺ identified with numeral 271, and RF⁻ identified with numeral 272. A differential output, OUT⁺ and OUT⁻, is identified with numeral 262, with OUT⁺ identified with numeral 263, and OUT⁻ identified with numeral 264.

A current steering mixer core 280 is also illustrated. As illustrated, the mixer core 280 comprises switches 266*a*, 266*b*, 266*c*, and 266*d* coupled between differential RF input source 270, and differential output 262 in the manner shown.

The switches 266*a*, 266*b*, 266*c*, and 266*d* are controlled by the signals a, b, c, and d as shown. Each switch is normally open, but is closed when one of the two signals associated with the switch in the figure is asserted. Thus, for example, switch 266*a* is closed when either of signals a or d is asserted; switch 266*b* is closed when either of signals c or b is asserted; switch 266*c* is closed when either of signals c or b is asserted; and switch 266*d* is closed when either of signals a or d is asserted.

When either of switches 266*a* or 266*d* is closed, this is equivalent to multiplying the incoming RF signal by +1, and providing the multiplied signal to the output. When either of switches 266*b* or 266*c* is closed, this is equivalent to multiplying the incoming RF signal by −1, and providing the multiplied signal to the output.

To explain this, note that when switch 266*a* is closed, RF⁺ is provided to OUT⁺, and when switch 266*d* is closed, RF⁻ is provided to OUT⁻. Given the differential nature of the output, that is, since the output is given by the difference OUT⁺−OUT⁻, it can be seen that the effect of either action is to multiply the incoming RF signal by +1, and provide the same to the output.

Similarly, note that when switch 266b is closed, RF⁺ is provided to OUT⁻, and when switch 266c is closed, RF⁻ is provided to OUT⁺. Again, given the differential nature of the output, it can be seen that the effect of either action is to multiply the incoming RF signal by −1, and provide the same to the output.

FIG. 18(*b*) illustrates the effective multiplication factor which is applied to the RF input by the mixer of FIG. 18(*a*) over a single period of the LO signal driving the preprocessor. As can be seen, during the first portion of the cycle, in which the "a" signal output from the preprocessor is active, the multiplication factor is +1, consistent with the closing of switches 266a and 266d. During the second portion of the cycle, when the "c" signal output from the preprocessor is active, the multiplication factor is −1, consistent with the closing of switches 266b and 266c. During the third portion of the cycle, when the "d" signal output from the preprocessor is active, the multiplication factor is +1, consistent with the closing of switches 266a and 266d. Finally, during the fourth portion of the cycle, when the "b" signal output from the preprocessor is active, the multiplication factor is −1, consistent with the closing of switches 266b and 266c.

The operation of the mixer of FIG. 18(*a*) can be further explained with reference to the waveforms of FIGS. 17(*a*)−(*b*). Waveform (1) represents the positive portion, RF⁺, of the incoming differential input current. Waveform (2) represents the negative portion, RF⁻, of the incoming differential input current. Waveform (3) represents an idealized form of the "a" signal, or $LO_0^+$, output from the preprocessor. Waveform (4) represents an idealized form of the "d" signal, or $LO_0^-$, output from the preprocessor. Waveform (5) represents an idealized form of the "c" signal, or $LO_{90}^+$, output from the preprocessor. Waveform (6) represents an idealized form of the "d" signal, or $LO_{90}^-$, output from the preprocessor. Waveform (7) represents the positive portion of the output signal, OUT⁺, which results. Waveform (8) represents the negative portion of the output signal, OUT⁻, which results.

Figure 22:
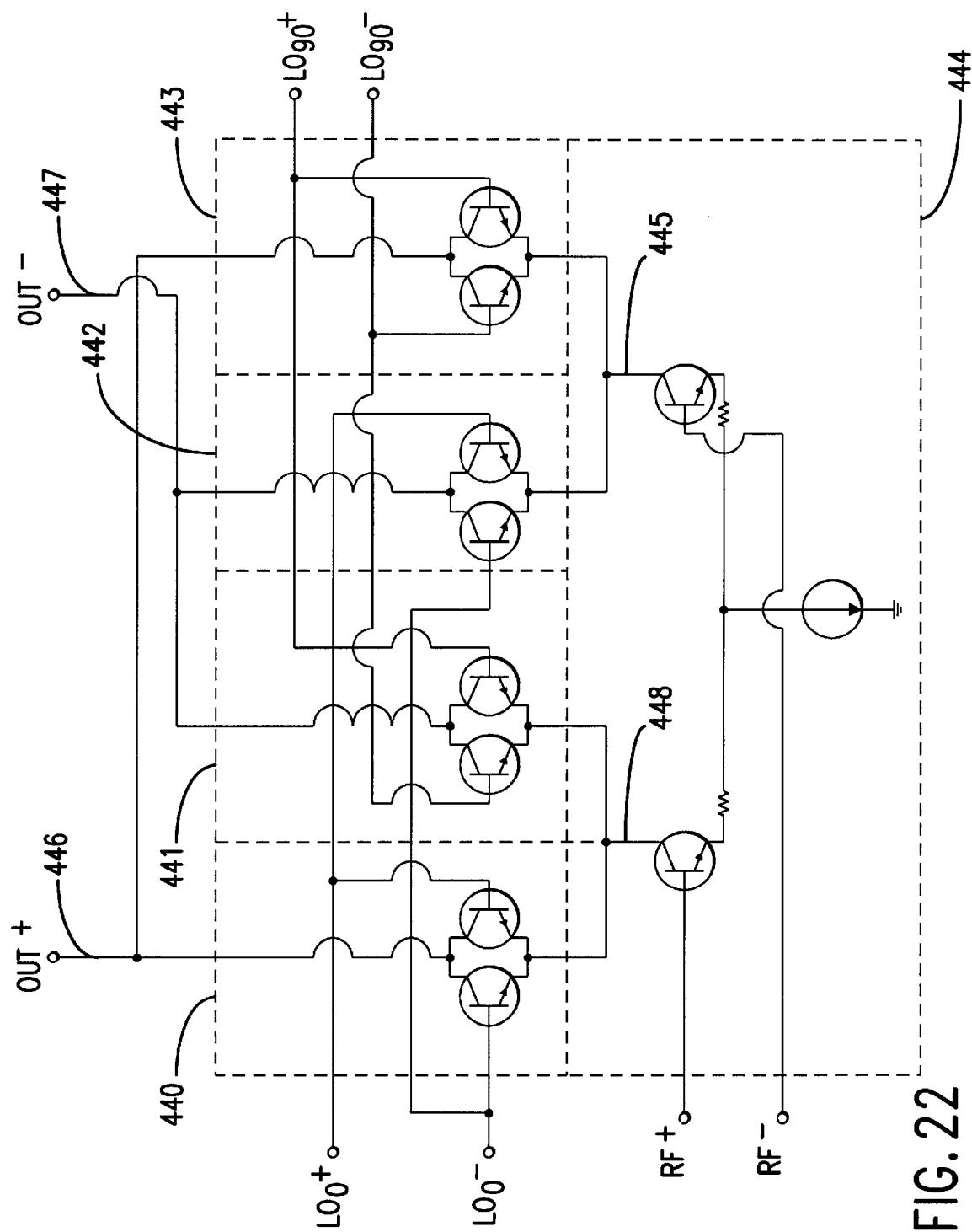
FIG. 22 illustrates an example implementation of a mixer in accordance with the subject invention.

FIG. 22 illustrates an implementation example of a mixer of the subject invention which is configured to operate from a differential RF input voltage, RF⁺ and RF⁻. A differential gm (transconductance) stage 444 is provided to function as a voltage to current converter. As illustrated, this stage comprises a degenerated differential pair which functions to reject the common mode input voltage, and output a differential current to nodes 448 and 445 respectively, with the positive portion of the current, IRF⁺, being applied to node 448, and the negative portion of the current, IRF⁻, being applied to node 445. The gm stage produces a differential current at these nodes which is proportional to the input differential RF input voltage.

Also provided is current steering mixer core 443 comprising switches 440, 441, 442, and 443 as shown. Each switch comprises in this embodiment two cross-coupled npn bipolar transistors. Switches 440 and 442 are configured to close whenever the $LO_0^+$ or $LO_0^-$ signals are active, that is, the "a" or "d" signals, and switches 441 and 443 are configured to close whenever the $LO_{90}^+$ or $LO_{90}^-$ signals are active, that is, the "c" or "b" signals.

Differential outputs 446 and 447 are also provided, with OUT⁺ identified with numeral 446, and with OUT⁻ identified with numeral 447. The mixer core 443 couples these outputs to the differential RF current inputs 448 and 445 in the manner shown. This implementation example operates in the manner described in relation to the block diagram and related waveforms of FIGS. 17(*a*)–(*b*), 18(*a*)–(*b*).

Figure 1:
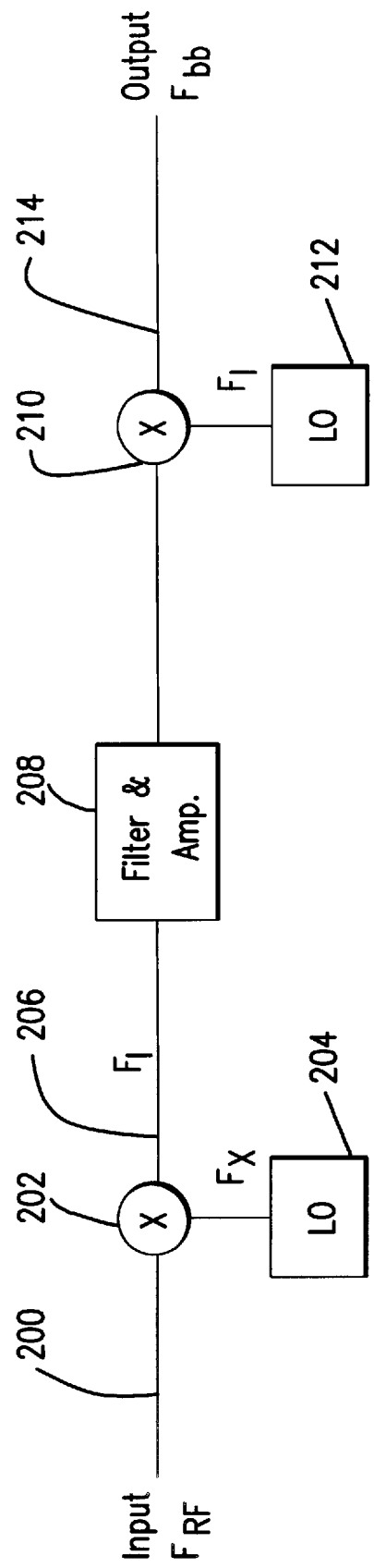
FIG. 1 illustrates a block diagram of a prior art demodulator.
Figure 2:
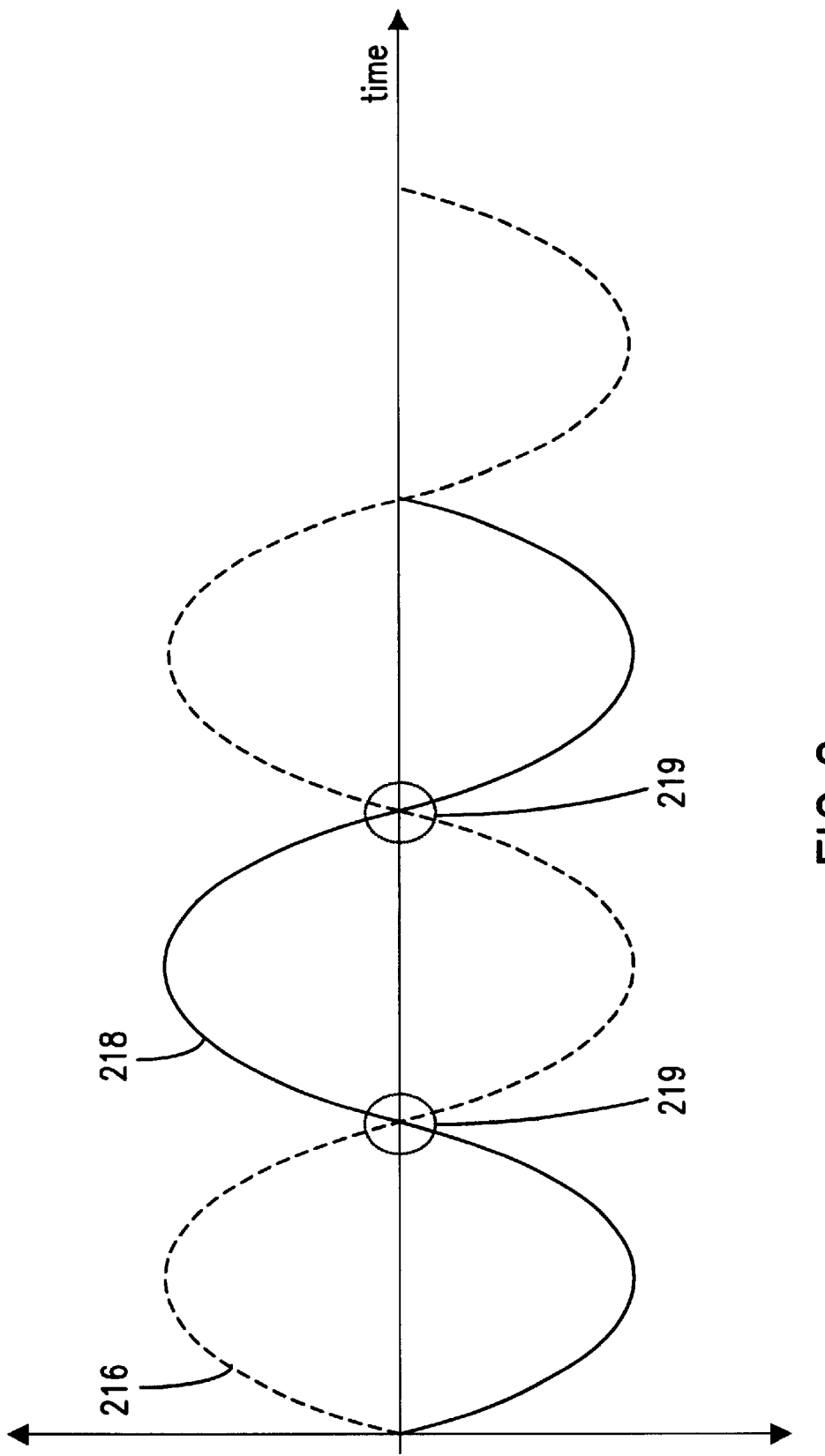
FIG. 2 illustrates a plot of output signals from a prior art local oscillator.
Figure 3:
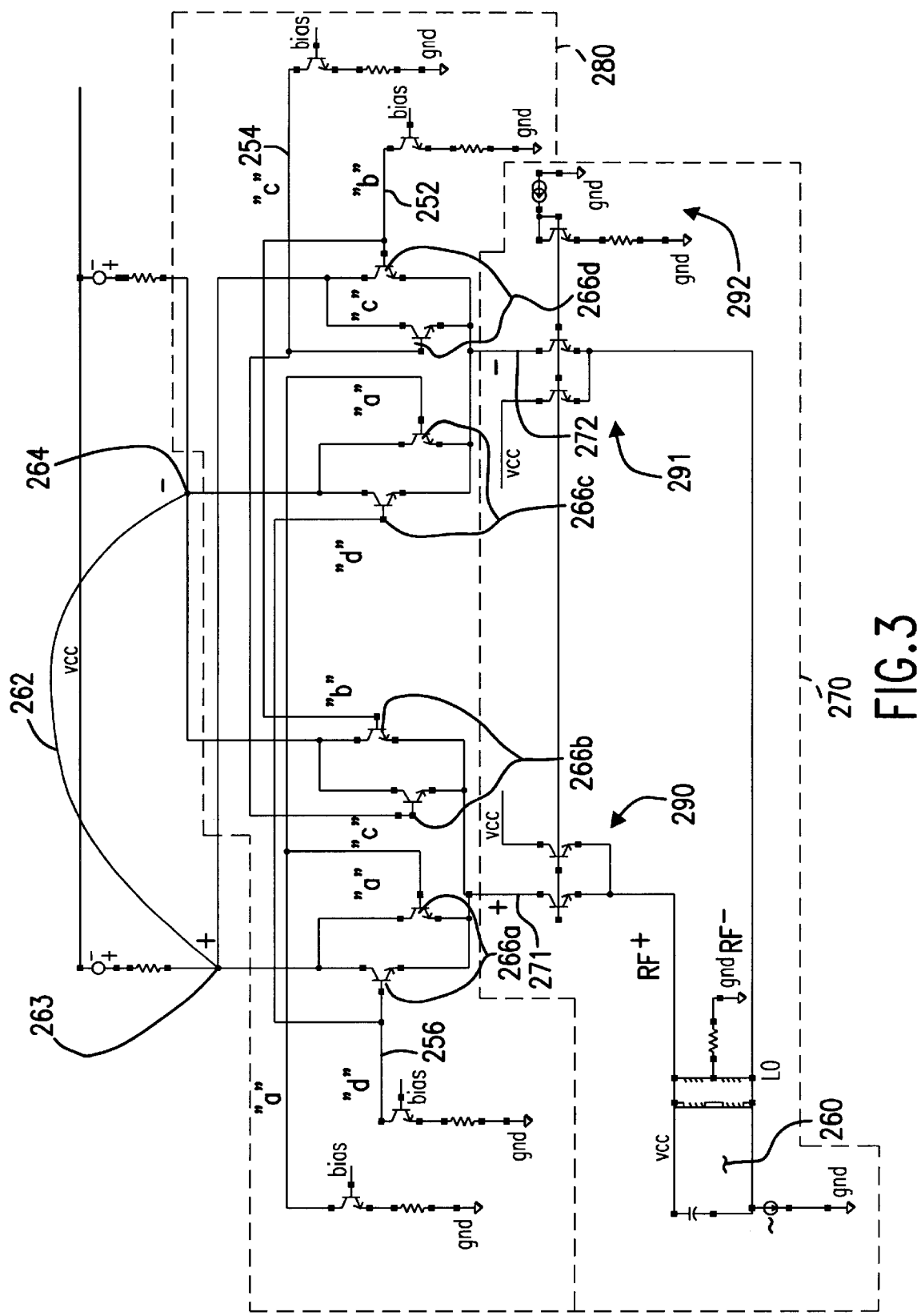
FIG. 3 illustrates a preferred implementation of a mixer in accordance with the subject invention.

FIG. 3 illustrates the current preferred implementation of a mixer in accordance with the subject invention. This mixer is a modified Gilbert cell mixer as is contemplated for use in a direct conversion receiver for a mobile wireless handset.

A receiver employing the modified Gilbert cell mixer shown in FIG. 3 is advantageously configured to demodulate an incoming signal from radio frequency to base band in a single stage. This desirably reduces the size, weight, expense and complexity of receivers employed in wireless handsets as compared to the prior art.

The preprocessor, in a manner to be discussed below in detail, processes the output signals of the local oscillator to establish desired signal characteristics therein, and thereafter output the processed signal including the desirable characteristics to the modified Gilbert cell mixer.

With reference to FIG. 3, the preferred mixer implementation comprises an input stage 270, a current steering mixer core 280, and differential output 262. In this implementation, source 260 is a single ended RF input which has been amplified by a low noise amplifier. The amplified signal is passed through a transformer which provided isolation and converts the single-ended signal to a differential signal current RF⁺ and RF⁻. The differential current signal is then passed through common base stages 290 and 291, which pass the current to nodes 271 and 272, respectively, and increase the impedance to achieve isolation with the input stage. A bias circuit 292 is provided to appropriately bias the common base stages 290 and 291.

The differential RF input currents are then passed to current steering mixer core 280, which, as illustrated, comprises switches 266a, 266b, 266c, and 266d. In this implementation, each of the switches comprises a pair of emitter/collector coupled npn bipolar transistors. The mixer core receives the differential RF currents as inputs over lines 271 and 272. Its also receives as inputs the four preprocessor signals, that is, the "a", "b", "c", and "d" signals. The "a" input on signal line 250, the "d" signal to signal line 256, the "c" signal to signal line 254, and the "b" signal to signal line 252.

Switches 266a and 266c close when either the "a" or "d" signals are asserted, and switches 266b and 266d close when either the "c" or "b" signals are asserted. In the implementation of FIG. 3, a signal is asserted when it has the highest value at a time. In other embodiments, a signal is asserted which it is the only signal in a predefined state at a time.

The differential output 262 has a positive portion, OUT⁺, and a negative portion, OUT⁻. The positive portion, OUT⁺, is provided on signal line 263, and the negative portion, OUT⁻, is provided on signal line 264. The mixer core couples the differential RF current inputs on signal lines 271 and 272 to the differential outputs 263 and 264 in the manner shown.

In operation, the preprocessed signals applied to inputs 250, 252, 254, and 256 are at a frequency which is about ½ the frequency of the incoming signal received at input port 260. The differential RF current output from the gm stage is applied to the mixer core through signal lines 271 and 272. The mixer core provides a switching action at twice the frequency of the preprocessor outputs provided to inputs 250, 252, 254, and 256. The result is that a differential output signal is provided to output port 262 which is representative of the product of a multiplication factor which switches between +1 and −1 at a rate which is twice the frequency of the preprocessor outputs, and the differential RF signal provided on signal lines 271 and 272. In short, the modified Gilbert mixer accomplishes sub-harmonic mixing by using a rectifying structure and a double-balanced mixer, including a gm-state with a cross-coupled current steering mixer core. In particular, the circuit advantageously uses a pair of bipolar transistors in a rectifying configuration to steer current at twice the frequency of the local oscillator. It should be appreciated, however, that in lieu of bipolar technology, MOS or CMOS technology can be used depending on the application. It should also be appreciated that the input stage 270 is entirely optional, as is the gm stage 444 in the implementation of FIG. 22, and can be eliminated or altered at the particular application.

The defining characteristics of this preferred implementation are considered to be a mixer core which receives differential RF current inputs, a mixer core which effectively switches at twice the LO frequency, and the generation of an output signal which is representative of the product of a multiplication factor which switches at twice the LO frequency and the RF differential input currents, all without generating a signal at twice the LO frequency at a pin or node.

To enhance operation of the modified Gilbert mixer shown in FIG. 3, the four output signals of the preprocessor provided to inputs 250, 252, 254, and 256 are preferably 90 degree phase-shifted versions of one another, with only one of the plurality of preprocessor outputs being clearly high at any moment. Each signal is preferably symmetric around a DC offset to avoid creation of even harmonics, and the rate of transition at defined transition points are as rapid and sharp as possible. In addition, the transition points are defined by zero crossover points between the signals. In a preferred embodiment, the outputs of the preprocessor comprise square waves such as shown in FIG. 17($a$).

4. First Embodiment of the Preprocessor of the Subject Invention

Figure 4:
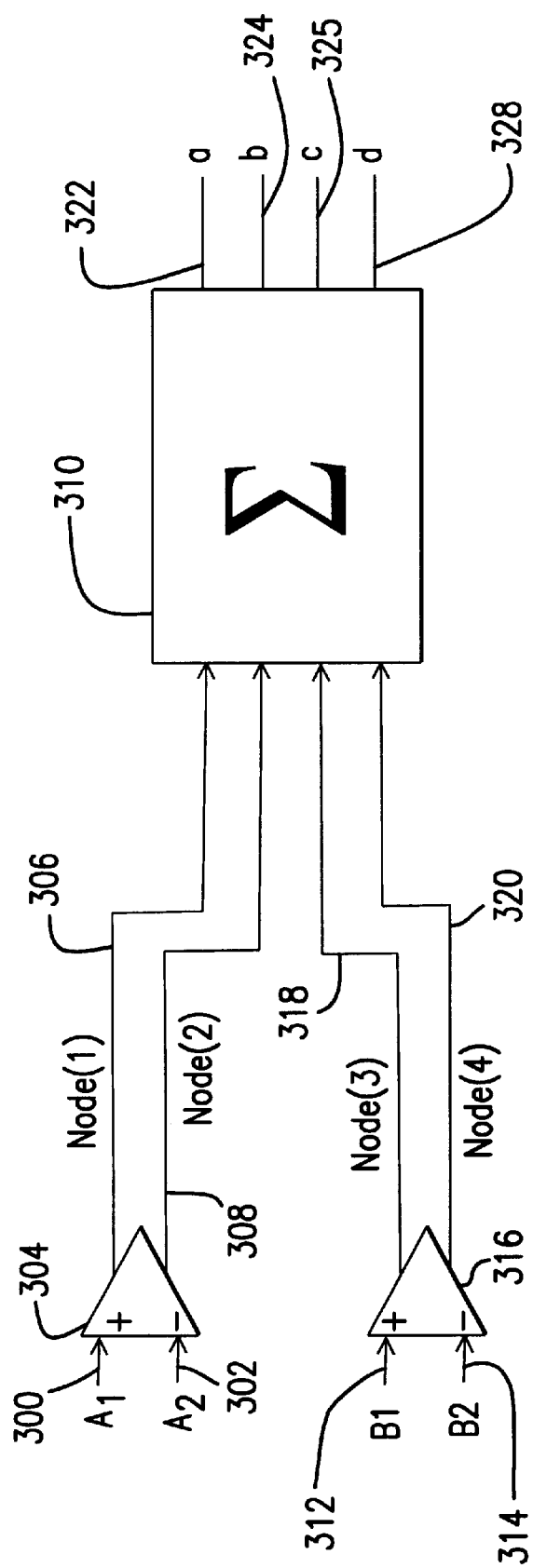
FIG. 4 illustrates a block diagram of a preprocessor of the subject invention.

FIG. 4 illustrates a block diagram of preprocessor circuitry in accordance with one embodiment of the subject invention. The preprocessing circuitry shown in FIG. 4 includes a first comparator 304 and a second comparator 316. The first comparator 304 includes an input A1 300 and an input A2 302. The first comparator 304 in this configuration includes dual outputs labeled herein for purposes of discussion as node(1) 306 and node(2) 308. Both of node(1) and node(2) 306, 308 connect to a summing unit 310.

A second comparator 316 includes an input B1 312 and an input B2 314. The second comparator 316 includes dual outputs labeled herein for purposes of discussion as a node(3) 318 and a node(4) 320. Both of node(3) 318 and node(4) 320 connect to summing unit 310. Summing unit 310 includes four outputs labeled for purposes of discussion as output a 322, output b 324, output c 326, and output d 328. These four outputs provide a stair step wave form as might be desirable in use with various electronic circuits. In one configuration, the outputs a, b, c, d of the preprocessor connect to the modified Gilbert cell of FIG. 3.

In operation, the first comparator 304 performs as a standard comparator as known by those of ordinary skill in the art. The comparator receives signals at input A1 300 and input A2 302. The following equations define the relationship between the inputs to the comparator and the outputs of the comparator provided at node(1) 306 and node(2) 308:

If $A1>A2$ then node(1)=1, node(2)=0

If $A1<A2$ then node(1)=0, node(2)=1

If $A1=A2$ then node(1)=0, node(2)=0

The operation of the second comparator 316 mirrors operation of the first comparator 304. The following equations define the relationship and operation of the second comparator 316.

If $B1>B2$ then node(3)=1, node(4)=0

If $B1<B2$ then node(3)=0, node(4)=1

If $B1=B2$ then node(3)=0, node(4)=0

The inputs on node(1) 306, node(2) 308, node(3) 318 and node(4) 320 are presented to the summing unit 310. Operation of summing units are known by those of ordinary skill in the art and are therefore not discussed herein beyond the following. The summing unit combines the inputs provided on nodes 1 through 4 to generate outputs a 320, b 324, c 326 and d 328. The following equations define operation of summing unit 310 in the first embodiment.

Output $c$=node(1)+node(3)

Output $a$=node(1)+node(4)

Output $d$=node(2)+node(3)

Output $b$=node(2)+node(4)

This defines the operation of one configuration of the preprocessing circuitry of the subject invention. It is contemplated that various other configurations and designs may be implemented which adopt the aspects of the subject invention.

Figure 5:
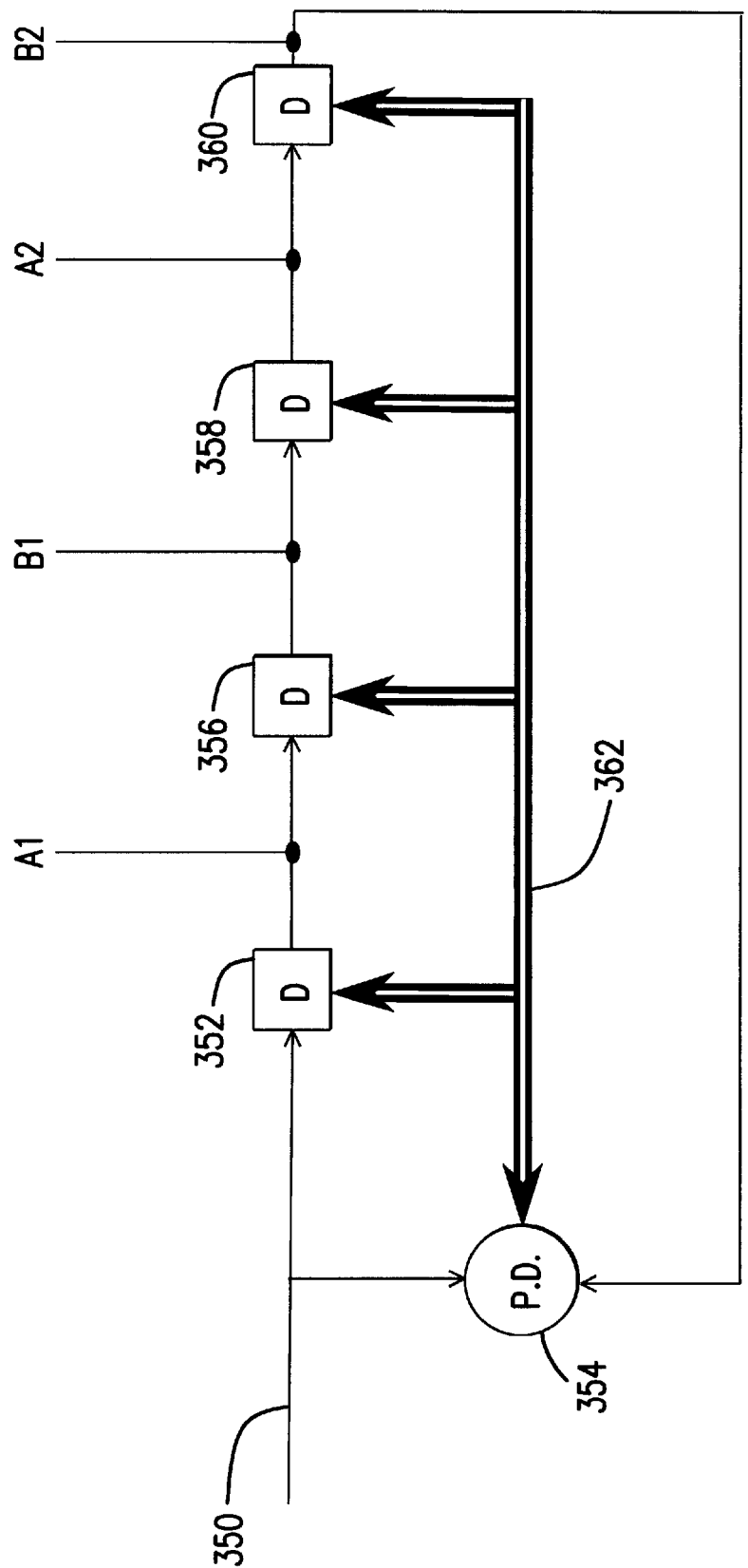
FIG. 5 illustrates a block diagram of an exemplary embodiment of a local oscillator.

Various type input signals may be presented to the inputs (A1 300, A2 302, B1 312, B2 314) of the preprocessing circuitry. One type of signal is a phase-split sine wave. However, it should be appreciated that other types of signals, such as square waves, ramps, or sawtooth waveforms are possible. FIG. 5 illustrates one example of a local oscillator configured to generate such a signal. This local oscillator is now discussed in detail.

An input line 350 connects to a first delay module 352, and a phase detector 354. Delay 352 connects to a delay 356, delay 356 connects to a delay 358, and delay 358 connects to a delay 360 in serial fashion as shown. In one preferred embodiment, each delay module is a programmable delay element. The phase detector 354 connects to each delay 352, 356, 358, 360 over respective ones of data lines 362.

Phase detector 354 also connects to the output of delay 360. Finally, a tap A1, A2, B1, B2 connects to the local oscillator intermediate each delay and after delay 360. Each of the taps A1, A2, B1, B2 correspond to and connect with the inputs of the preprocessor circuitry shown in FIG. 4.

In operation, a sine wave signal is provided on an input 350 to delay 352 and phase detector 354. The phase detector records the phase of the received sine wave in relation to the signals output from each of the delay modules 352, 356, 358, and 360. The delays in each of the modules 352, 356, 358, and 360 are adjusted until the phase between the incoming signal on line 350, and the outputs of each of the modules, is 0. At this point, each of the signals output on taps A1, B1, A2, and B2 will be 90° out of phase with respect to the adjacent signal.

As previously discussed, the taps A1, A2, B1, B2 on the local oscillator circuitry provide four input signals to the preprocessor system shown in FIG. 4, which are likewise labeled A1, A2, B1, B2. It is contemplated that various other circuitry or configurations may be adopted to achieve any of a number of desired inputs for the preprocessor circuitry shown in FIG. 4.

Figure 6:
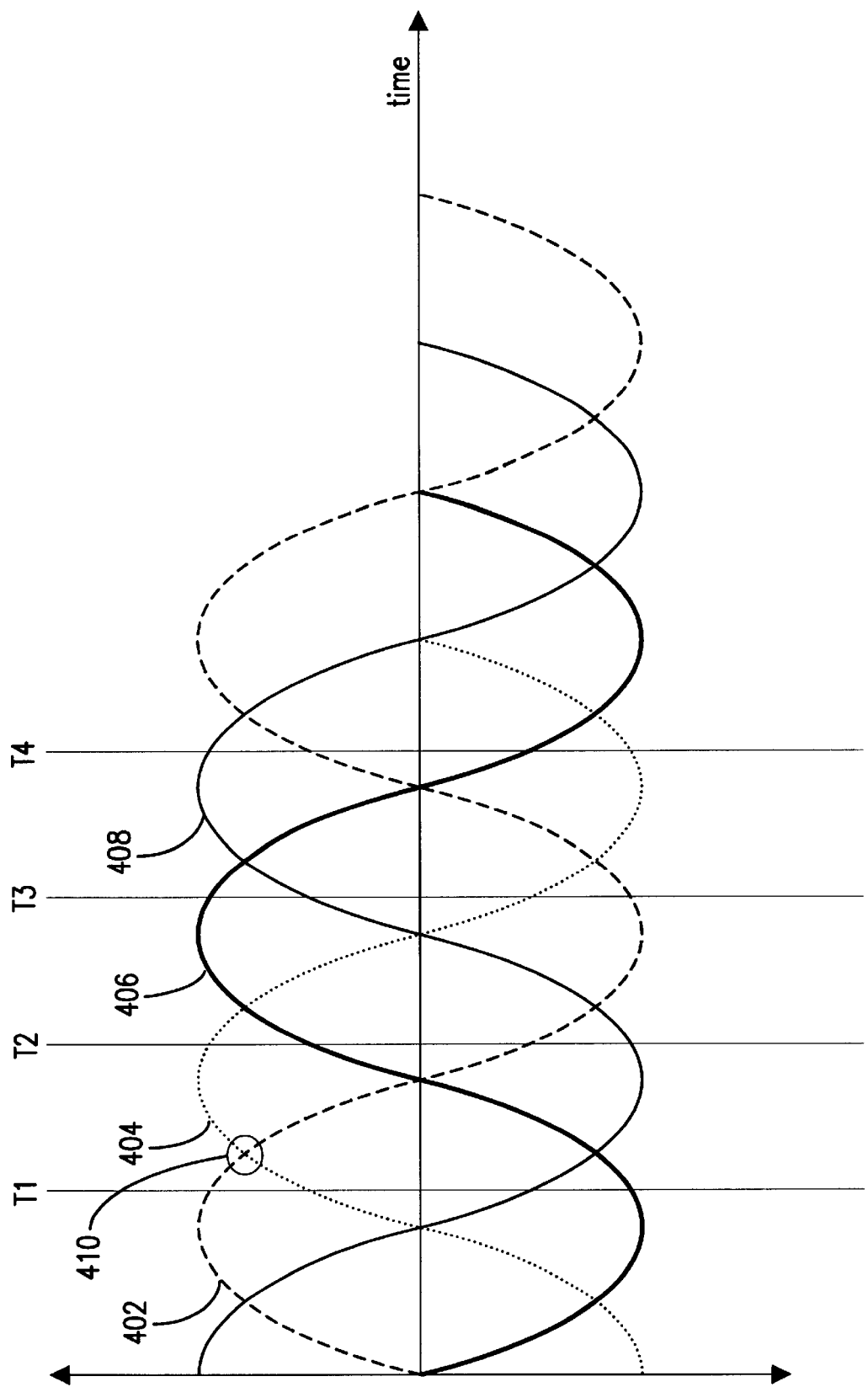
FIG. 6 illustrates a plot of output signals from a four-output local oscillator.

FIG. 6 illustrates a plot of a sample output from the local oscillator of FIG. 5. A reference signal 402 is presented to input A1 300 of the preprocessor circuit. A 90 degree phase-shifted signal 404 (as compared to reference signal 402) is presented to input B1 312 of the preprocessor circuit. A 180 degree phase-shifted signal 406 (as compared to reference signal 402) is presented to input A2 302 of the preprocessor circuit. A 270 degree phase-shifted signal 408 (as compared to reference signal 402) is presented to input B2 314 of the preprocessor circuit. The four signals 402, 404, 406, 408 are each offset by 90 degrees.

However, these four signals suffer from certain real world drawbacks which make it undesirable to directly input them to the mixer of FIG. 3. First, the slopes of the signals at transition points 410 are not very steep which is to say the signals 402 and 404 are not rapidly increasing or decreasing in value with respect to time. Such soft transitions between signals cause switching systems, such as current steering transistors of the mixer of FIG. 3, to assume a half-switched state. This is undesirable for two primary reasons. First, when a transistor is half-switched, it is in a zero gain state. Second, half-switched transistors introduce noise onto the output. This occurs because, in the configuration of the Gilbert mixer, a half-switched transistor will cause a reduction in the apparent resistance at the emitters of opposing transistor pairs, which increases the shot noise the transistor generates.

Figure 7:
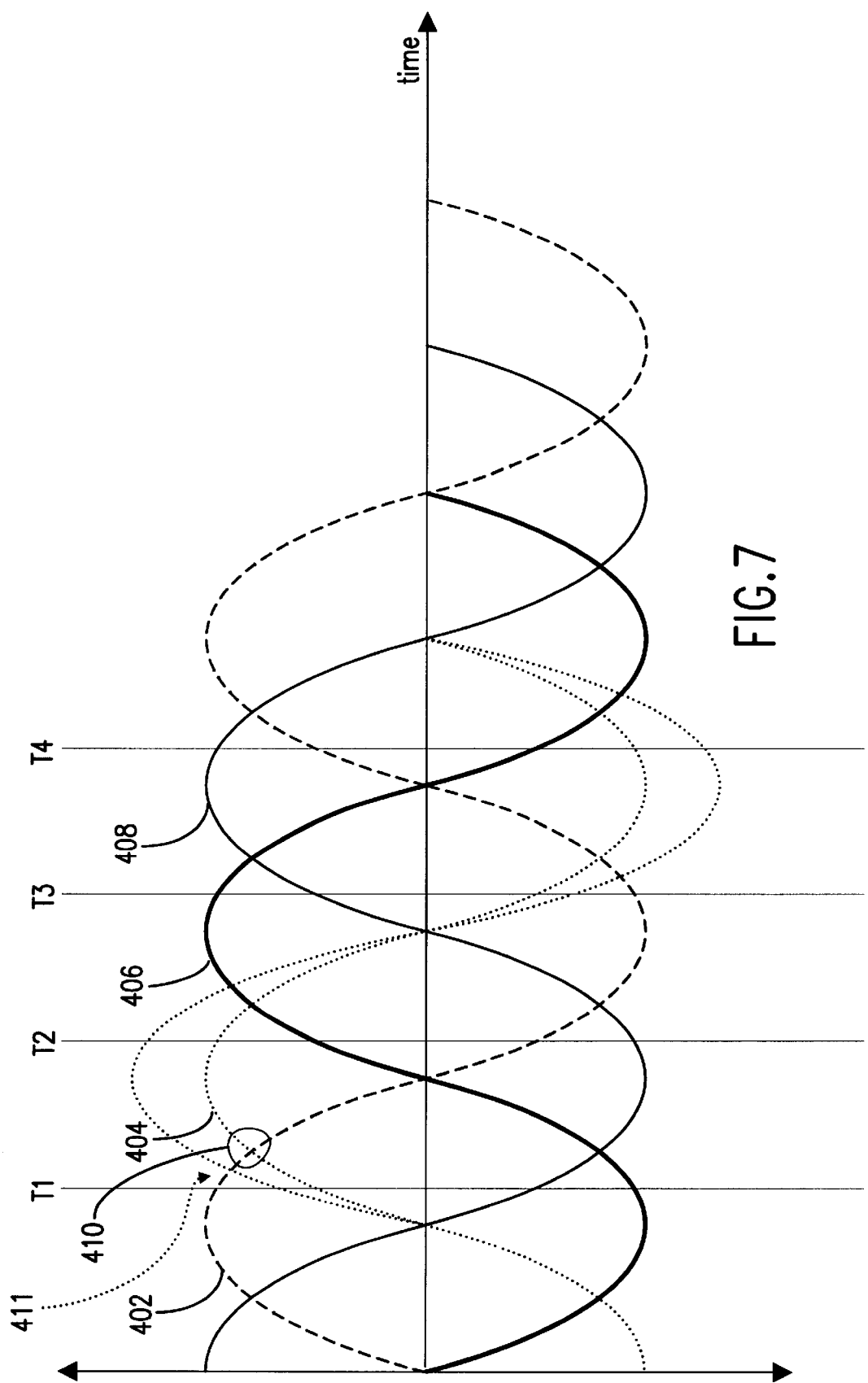
FIG. 7 illustrates a plot of transition point variance due to amplitude differences in output signals from a four-output local oscillator.

Another undesirable characteristic of the signals of FIG. 6 is that the transition points 410 are highly sensitive to changes in the amplitude of each local oscillator output signal. This is undesirable because, when these signals are directly input to the mixer of FIG. 3, these transition points define the points at which the mixer changes polarity. Consequently, the switching action of the mixer will be difficult to precisely control. FIG. 7 illustrates this phenomenon. When the amplitude of signal 404 increases, the transition point 411 changes in time to point 410, thereby altering the mixer operation. Because it is difficult to precisely maintain control over the amplitude of the signals 402, 404, 406, and 408 output from a local oscillator, it is undesirable to directly input these signals to the mixer.

Yet another aspect of the signals of FIG. 6 that hinders their use as direct inputs to the mixer of FIG. 3 is that, due to factors such as the limitations of current local oscillators, these signals are not generally true sinusoidal signals, but, in fact, are generally flat at maximum and minimum values. The result is even softer transitions which further contributes to the undesirable effects of directly inOputting these signals to a mixer.

5. Method of Operation of the Preprocessor of the Subject Invention

Figure 8:
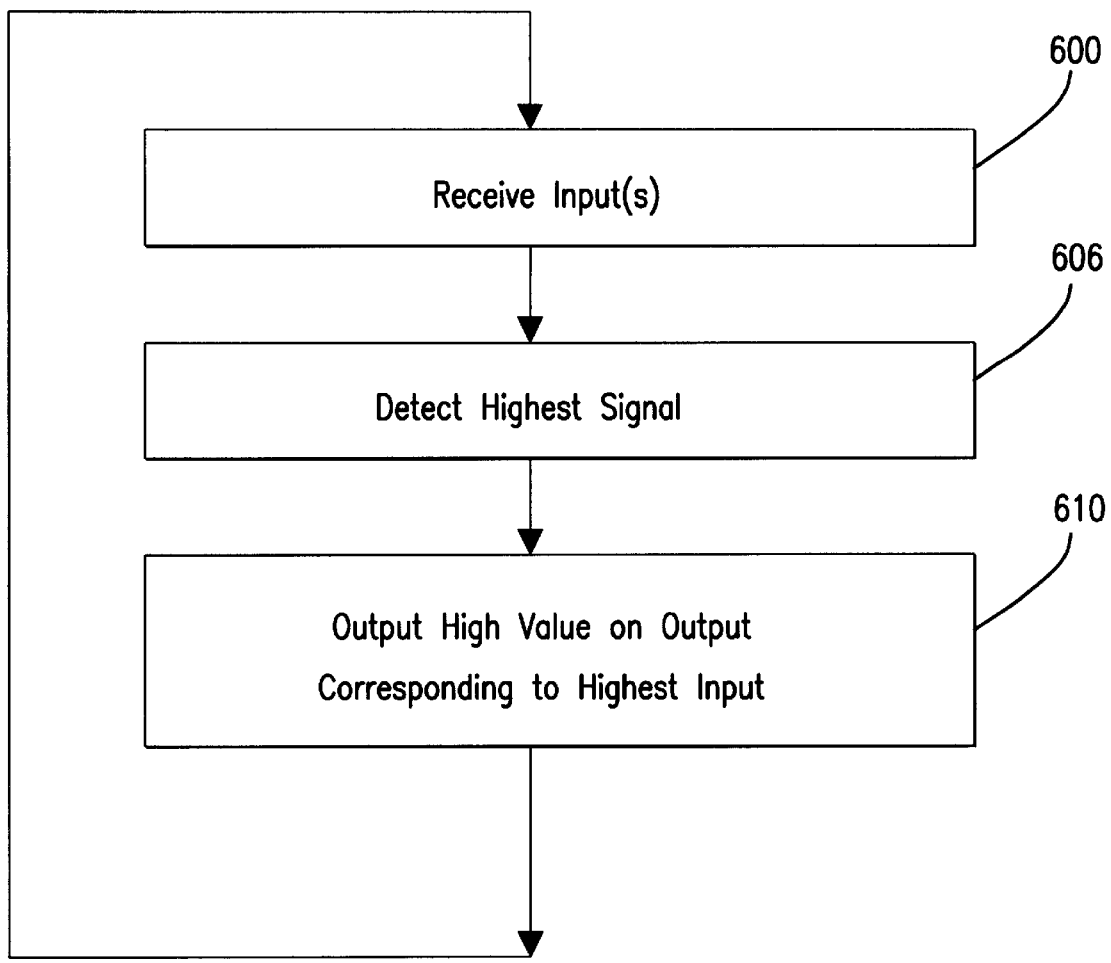
FIG. 8 illustrates an operational flow chart of one method of operation of the subject invention.

FIG. 8 illustrates a general method of operation of the preprocessor in one embodiment of the subject invention. According to this embodiment, each input of the preprocessor is associated with a particular output of the preprocessor. At a step 600, the preprocessor receives inputs only one of which is high at a particular moment. At a step 606, the preprocessor detects which signal is high. At a step 608, the preprocessor outputs a high value on an output corresponding to the input receiving the high value.

Figure 9:
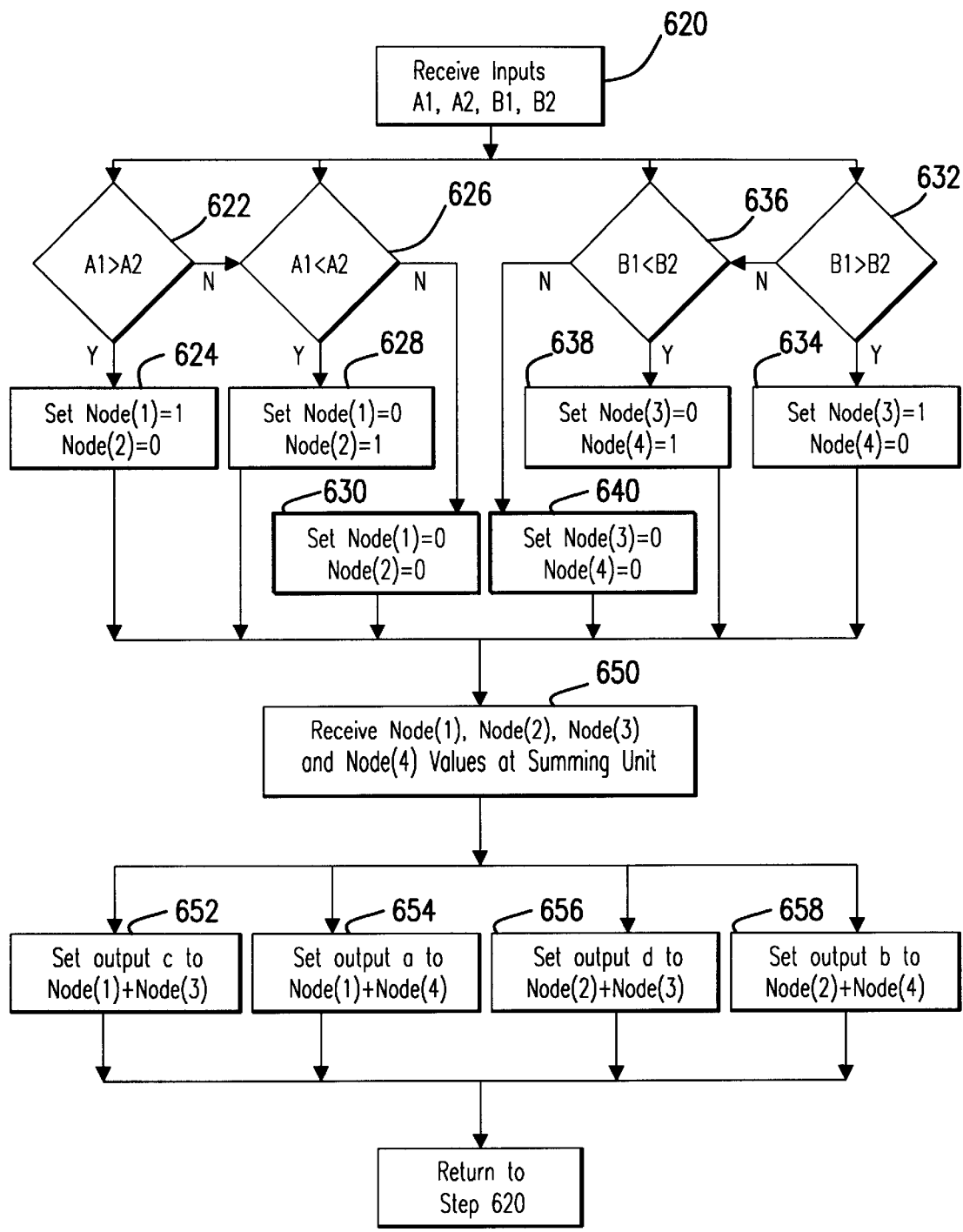
FIG. 9 illustrates an operational flow chart of one method of operation of the first embodiment of the subject invention.

FIG. 9 illustrates a more specific method of operation of the first embodiment of the subject invention. At a step 620 the preprocessor receives signal inputs on comparator lines A1, A2, B1 and B2.

Next, at a step 622 the first comparator analyzes signals at inputs A1 and A2. If A1>A2 then the operation progresses to a step 624. At a step 624, the first comparator outputs a positive value (+1 in the present embodiment) on node(1) and a 0 on a node(2).

If at step 622 the comparator determines that signal at input A1 is less than the signal at input A2, then the operation progresses to a step 626 to determine if A1<A2. If the outcome at step 626 is affirmative, the output on node(1) is set to 0 and the output on node(2) is set to 1, step 628.

If, however, A1 equals A2, then the operation progresses to a step 630 and node(1) and node(2) are set to zero. This is a transition point in the output signal.

The operation of the second comparator, shown in steps 632, 634, 636, 638, 640, generally mirrors the operation of the first comparator shown in steps 622, 624, 626, 628, and 630, and therefore need not be discussed further.

Next, at a step 650, the operation forwards the values at node(1), node(2), node(3), and node(4) to a summing unit. Summing unit may be configured to combine the comparator output in various patterns.

In the first embodiment, at a step 652, the operation sets output c to the value of node(1)+node (3).

At a step 654, the operation sets output a to the value of node(1)+node (4).

At a step 656, the operation sets output d to the value of node(2)+node (3).

At a step 658, the operation sets output b to the value of node(2)+node (4).

This process dynamically repeats on an on-going basis at the local oscillator input frequency.

It is important to note that the input and output signals shown correspond to one example format of input and corresponding output. Various other input formats may be adopted which yield other output formats. For example, signals other than a sinusoidal signal may be chosen as input signals. Other examples that are possible include square, sawtooth, and ramp waves. Similarly, rather than analog circuitry, the subject invention may be implemented using discrete logic, digital signal processing or software code. The present invention is intended to broadly encompass any implementation configuration that dynamically alters an input or generates new outputs having one or more of the desired signal characteristics described herein.

6. Waveforms for the First Embodiment of the Preprocessor

The input/output waveforms for the first embodiment of the preprocessor is based upon input into the preprocessor of the signals shown in FIG. 6. In the present example, signal 402 is provided to input A1 300, a signal 404 is provided to input B1 312, a signal 406 is provided to input A2, and a signal 408 is provided to input B2.

Figure 10:
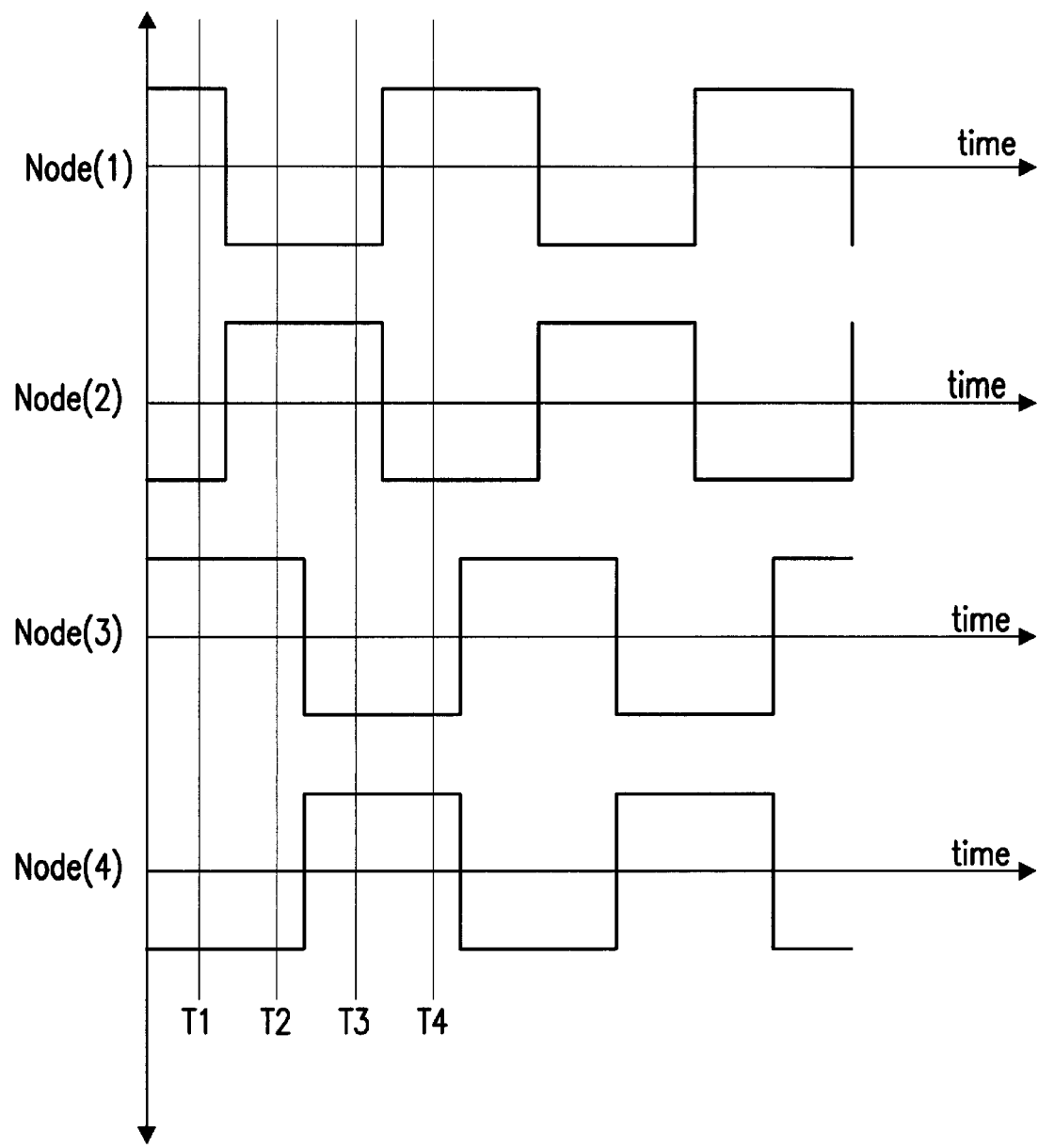
FIG. 10 illustrates a plot of comparator output signals at times T1 through T4 in accordance with one subject embodiment of the invention.

FIG. 10 illustrates the ideal output signals from first comparator 304 and second comparator 316. Four specific time designations, T1, T2, T3, T4, are shown with each time designation being 90 degrees out of phase. These designations correspond to those depicted in FIG. 6. The comparator outputs 304, 316 in the embodiment of FIG. 4 are summarized in TABLE 1 below at each of these time designations.

TABLE 1

| Signal Values | Time T1 | Time T2 | Time T3 | Time T4 | Reference Figure |
|---|---|---|---|---|---|
| Input A1 | A2 > A2 | A1 < A2 | A1 < A2 | A1 > A2 | FIG. 6 |
| Input A2 | // | // | // | // | FIG. 6 |
| Input B1 | B1 > B2 | B1 > B2 | B1 < B2 | B1 < B2 | FIG. 6 |
| Input B2 | // | // | // | // | FIG. 6 |
| Node(1) | 1 | 0 | 0 | 1 | FIG. 10 |
| Node(2) | 0 | 1 | 1 | 0 | FIG. 10 |

TABLE 1-continued

Figure 11:
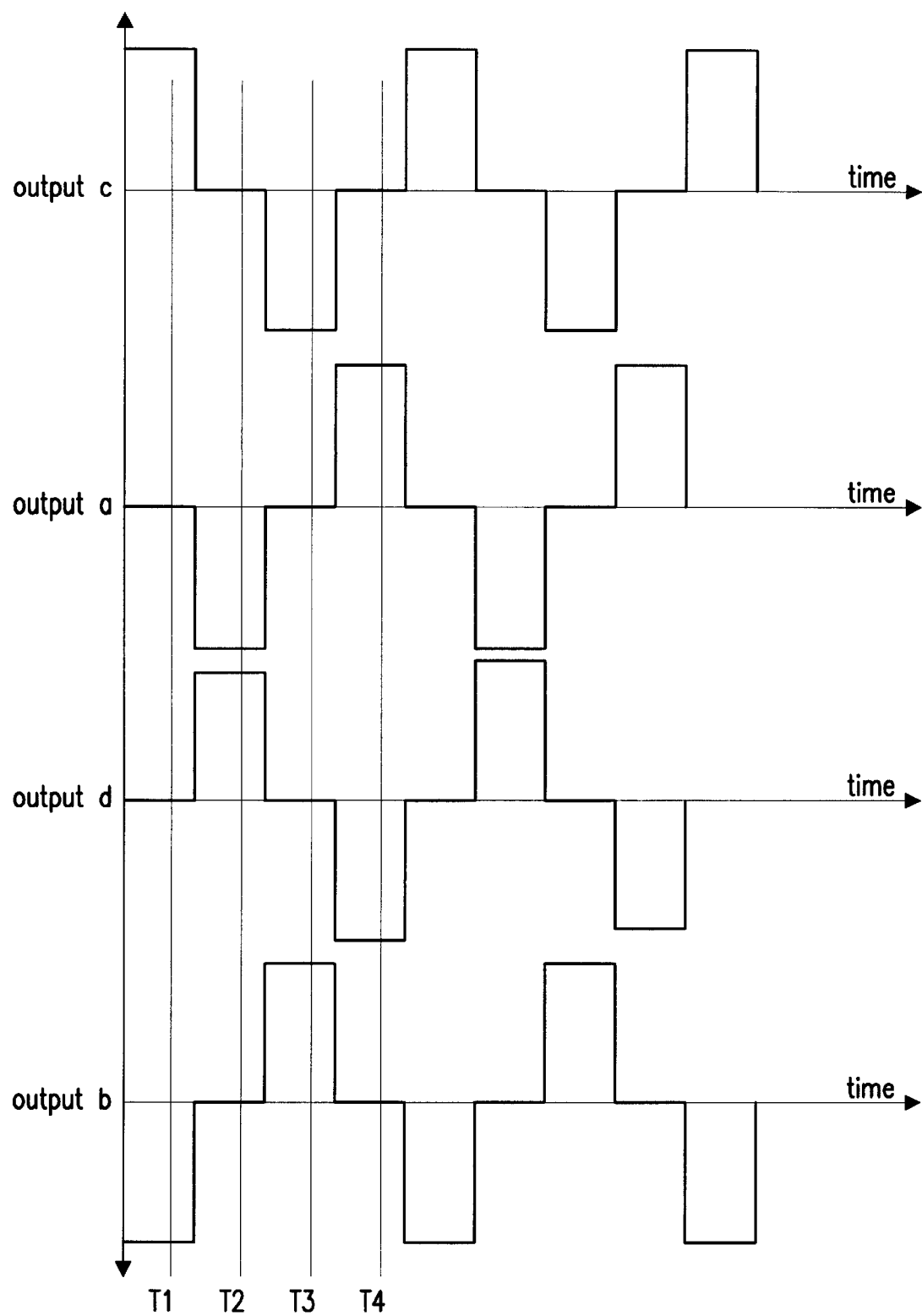
FIG. 11 illustrates a plot of summing unit output signals at times T1 through T4 in accordance with one embodiment of the subject invention.

| Signal Values | Time T1 | Time T2 | Time T3 | Time T4 | Reference Figure |
|---|---|---|---|---|---|
| Node(3) | 1 | 1 | 0 | 0 | FIG. 10 |
| Node(4) | 0 | 0 | 1 | 1 | FIG. 10 |
| Output c (1 + 3) | 2 | 1 | 0 | 1 | FIG. 11 |
| Output a (1 + 4) | 1 | 0 | 1 | 2 | FIG. 11 |
| Output d (2 + 3) | 1 | 2 | 1 | 0 | FIG. 11 |
| Output b (2 + 4) | 0 | 1 | 2 | 1 | FIG. 11 |

Comparator Output at Time T1

With reference to FIG. 10 and TABLE 1, at a time T1, the first comparator 304 (FIG. 4) compares the value of sine signal 402 and sine signal 406 (FIG. 6) revealing that signal 402 is greater than signal 406. Accordingly, the first comparator 304 outputs a positive value on node(1), a 1 value for purposes of discussion, and a 0 value on node(2). Second, comparator 316 performs a similar analysis on sine signal 404 at input B1 312 and sine signal 408 at input B2 314. At time T1, signal 404 is greater than signal 408 causing second comparator 316 to output a 1 value on node(3) and a 0 value on node(4). FIG. 10 illustrates the value of each signal at a time T1.

Comparator Output at Time T2

At a time T2, the value of signal 406 is now greater than the value of signal 402, causing first comparator output node(1) to switch to 0 and node(2) to switch to 1. FIG. 10 illustrates this transition at time T2 for node(1) and node(2). The output of at node(3) and node(4) remains unchanged because the value of signal 404 remains greater than the value of signal 408.

The comparison process repeats at a time T3 and T4 as shown in TABLE 1 and FIG. 10.

Summing Unit at Time T1

In reference to FIG. 11 and TABLE 1, at a time T1, the summing unit combines the signals at node(1) and node(3) to yield a value 2 at output a 322. Output a 324 is the combination of the signals on node(1) and node(4) thereby yielding a signal value at time T1 of 1. Output d 326 is the combination of the signals on node(2) and node(3) thereby yielding a signal value at time T1 of 1. Output b 326 is the combination of the signals on node(2) and node(4) thereby yielding a signal value at time T1 of 0. FIG. 11 illustrates the output of the summing unit 310 at a time T1. This process repeats at times T2, T3, and T4 as shown.

Provided at the outputs a, b, c, d, of the preprocessor are four stair step signals as shown in FIG. 11.

7. Advantages of the Preprocessor of the Subject Invention

The outputs of the preprocessor possess distinct advantages in relation to the outputs from the local oscillator circuit. In applications involving inputting these signals to a mixer, such as the modified Gilbert mixer of FIG. 3, these differences are believed to be important for commercial viability.

One desirable characteristic possessed by the preprocessor outputs is substantial symmetry with respect to a DC offset. This is desirable because it results in elimination of even harmonics in the signals which could couple or leak to the RF input of the mixer, and, when mixed with the original LO input in the mixer of FIG. 3, produce a baseband component which interferes with the output of the mixer.

Another desirable characteristic of the preprocessor outputs is sharp and rapid transitions at defined switching or transition points. This avoids the effects of half-switching described above.

A third desirable characteristic is switching or transition points which are defined by zero or other DC offset crossings between adjacent signals. This is desirable because it eliminates dependence of these crossover points on the amplitudes of the underlying signals.

Another advantage of the preprocessor of the present invention is its ability to reduce or eliminate unwanted coupling or leakage from the RF input to the LO input of the mixer. In systems lacking preprocessing as described herein, a strong blocker may be present on the RF input line and thus couples itself onto the local oscillator lines. During the mixing process, the unwanted blocker frequencies cause DC interference in the output signal. This type of coupling occurs even though the actual local oscillator oscillates at about ½ the desired RF frequency, because the mixer core switches polarity 4 times per local oscillator cycle, i.e. at twice the local oscillator frequency. The preprocessor can reduce the DC error in the mixer output resulting from the RF blocker by over 40 dB.

The derivation of this conclusion will now be provided. With reference to FIG. 14(b), the transitions of the mixer polarity are labelled ($\tau_1, \tau_2, \tau_3, \tau_4$) These transitions occur when two local oscillator signals cross one another, causing switching between two separate transistors in the mixer core. Thus, the relational timing of $\tau_1, \tau_2, \tau_3, \tau_4$ is important.

However, interference undesirably affects the timing of $\tau_1, \tau_2, \tau_3$, and $\tau_4$. This is undesirable because shifting $\tau_1, \tau_2, \tau_3, \tau_4$ has an effect on the selectivity performance of the mixer. This change in timing occurs because each change in mixer polarity occurs at the crossing of two local oscillator signals. Hence when an interferring signal couples on top of one of these local oscillator signals, it can shift the time of the switch.

For example, assuming the local oscillator signals are sinusoidal for a small interferring signal of magnitude $V_{int}$, at $\tau_1$, the transition time will be shifted:

$$\tau'_1 - \tau_1 = \frac{\sqrt{2}}{2} \frac{V_{int}(\tau_1)}{2\pi - F_{LO}V_{LO}} = \Delta_1$$

and at $\tau_2$:

$$\tau'_2 - \tau^*_2 = \frac{-\sqrt{2}}{2} \frac{V_{int}(\tau_2)}{2\pi - F_{LO}V_{LO}} = \Delta_2$$

where $V_{LO}$ and $F_{LO}$ are the amplitude and frequency of the local oscillator respectively.

Now, if $V_{int}(t) = A \cos(2\pi F_{RF}t + \phi(t))$ (where $F_{RF}$ is the desired RF frequency and $\phi(t))$ is a slow-varying phase) as in the case of an in-band blocker, then as the local oscillator signal progresses from $\tau_1$ to $\tau_2$, passing through ¼ of its cycle, or 90°, $V_{int}(t)$ passes through 180° and so reverses polarity. (The references to polarity and polarity reversing in this section refer to the same concept discussed earlier in relation to the effective switching action of a multiplication factor at a rate which is twice the LO frequency.) In other words, $V_{int(\tau 1)} = -V_{int(\tau 2)}$, which is equivalent in mathematical terms to:

$$\Delta_1 = \Delta_2 = \frac{\sqrt{2}}{2} \frac{A\cos(2\pi F_{RF}\tau_1 + \phi(t))}{2\pi F_{LO}V_{LO}}$$

The next question is how the foregoing shifts in the switching times $\tau_1, \tau_2$ etc. affects the performance of the mixer. The output of the mixer is simply the product of its polarity and its RF input. Thus, the Fourier coefficients of the mixer polarity over time describe the behavior of the mixer.

To ease the following mathematical discussion, a few transforms are needed:

$$x = \tau - \frac{T}{8} \text{(where } T \text{ is the period of the } LO\text{)}$$

Therefore, it follows:

$$x_1 = \tau_1 - \frac{T}{8}, x_2 = \tau_2 - \frac{T}{8}, x_3 = \tau_3 - \frac{T}{8}, x_4 = \tau_4 - \frac{T}{8}$$

$$f(x) = (polarity)/2 + \frac{1}{2}$$

Starting with:

$$f(x) = \sum_{n=o}^{\infty} a_n \cos\left(\frac{2\pi nx}{T}\right) + b_n \sin\left(\frac{2\pi nx}{T}\right)$$

$$a_0 = \frac{1}{T}\left(\int_{x_1}^{x_2} dx + \int_{x_3}^{x_4} dx\right) = \frac{x_2 + x_4 - x_1 - x_3}{T}$$

$$a_n = \frac{2}{T}\int_{x_1T}^{x_2} \cos\left(\frac{2\pi nx}{T}\right)dx + \frac{2}{T}\int_{x_3}^{x_4} \cos\left(\frac{2\pi nx}{T}\right)dx$$

$$= \frac{1}{n\pi}\left(\sin\left(\frac{2\pi nx_2}{T}\right) + \sin\left(\frac{2\pi nx_4}{T}\right) - \sin\left(\frac{2\pi nx_1}{T}\right) - \sin\left(\frac{2\pi nx_3}{T}\right)\right)$$

$$b_n = \frac{-1}{n\pi}\left(\cos\left(\frac{2\pi nx_2}{T}\right) + \cos\left(\frac{2\pi nx_4}{T}\right) - \cos\left(\frac{2\pi nx_1}{T}\right) - \sin\left(\frac{2\pi nx_3}{T}\right)\right)$$

and applying this to the case in which a RF blocker has coupled onto the sinusoidal local oscillator output:

$$x_1 = \frac{\sqrt{2}\,A\cos(\phi(t))}{4\pi F_{LO} V_{LO}}$$

$$x_2 = \frac{T}{4} + \frac{\sqrt{2}\,A\cos(\phi(t))}{4\pi F_{LO} V_{LO}}$$

$$x_3 = \frac{T}{2}$$

$$x_4 = \frac{3T}{4}$$

Upon solving for the Fourier coefficients;

$$a_0 = \frac{1}{2}$$

$$a_1 = \frac{-\sqrt{2}\,A\cos(\phi(t))}{2V_{LO}\pi} \quad b_1 = \frac{\sqrt{2}\,A\cos(\phi(t))}{2V_{LO}\pi}$$

$$a_2 = \frac{-\sqrt{2}\,A\cos(\phi(t))}{V_{LO}\pi} \quad b_2 = \frac{2}{\pi}$$

In the foregoing, the $a_2$ is the problem. It results in the following term in the output:

$$a_2 \cos\left(\frac{4\pi t}{T}\right) = -\frac{\sqrt{2}\,A\cos(\phi(t))}{V_{LO}\pi}\cos\left(\frac{4\pi t}{T}\right)$$

$$= \frac{-\sqrt{2}\,A}{2V_{LO}\pi}\left[\cos\left(\frac{4\pi t}{T} + \phi(t)\right) + \cos\left(\frac{4\pi t}{T} - \phi(t)\right)\right]$$

where the first term directly above is identical to the original RF blocker on the RF input, $$\left(A\cos(2\pi f_{RF}t + \phi(t)), \text{ where } F_{RF} = \frac{2}{T}\right).$$

Hence this term will mix down the blocker to DC.

The next question is the effect preprocessing has on this mechanism. There are two different places where an RF blocker can couple onto the local oscillator (LO) signal or signals: 1) prior to preprocessing; and 2) after preprocessing.

If a RF blocker couples onto the local oscillator signal after preprocessing, a similar mechanism will be active. However, the effect will be reduced for two reasons: 1) The physical connections between preprocessor and mixer can be kept short, thereby reducing the coupling effect to negligible levels; and 2) the signal transitions after preprocessing will be considerably faster and steeper, thereby reducing the effects of time-shifting by a factor of $$\frac{1}{\sqrt{2}\cdot(gain)}$$

where (gain) is the input gain of the preprocessor.

Alternatively, if an RF blocker couples onto the local oscillator signal before it is preprocessed, an entirely different mechanism comes into play. Because the preprocessor compares $LO_o$ with $LO_{180}$ and $LO_{90}$ with $LO_{270}$ to generate two 90° phase-shifted square waves which are summed, with reference to FIG. 17(a)(5), an RF blocker riding on $LO_{90}$, for example, can only affect $x_1$ and $x_3$.

For a given (sinusoidal) local oscillator signal, switching is generated only at zero-crossings, which are 180° apart. An RF blocker, meanwhile, will pass through 360° between transitions, meaning that it will have approximately the same value at both transitions. The same value at both transitions causes the $a_2$ term to reduce to zero. It can be shown that:

$$x_1 = \frac{1}{2}\frac{V_{int}(\phi(t))}{2\pi F_{LO} V_{LO}}$$

$$x_3 = \frac{T}{2} - \frac{1}{2}\frac{V_{int}(\phi(t))}{2\pi F_{LO} V_{LO}} = \frac{T}{2} - x_1$$

Once again, setting $V_{int} = A\cos(2\pi F_{RF}t + \phi(t))$, the following results:

$$x_1 = \frac{A\cos(\phi(t))}{4\pi F_{LO} V_{LO}} \quad x_2 = \frac{T}{4}$$

$$x_3 = \frac{T}{2} - \frac{A\cos(\phi(t))}{4\pi F_{LO} V_{LO}} \quad x_4 = \frac{3T}{4}$$

Solving for the Fourier coefficients:

$$a_0 = \frac{1}{2}$$

$$a_1 = \frac{A\cos(\phi(t))}{\pi V_{LO}} \quad b_1 = 0$$

$$a_2 = 0 \quad b_2 = \frac{2}{\pi}$$

where $a_2$ and $b_2$ are independent of $\phi(t)$. Therefore, RF blockers coupling onto the local oscillator links before preprocessing do not mix themselves down.

In summary, without preprocessing, assuming sinusoidal local oscillator outputs, the DC error resulting from the RF blocker is;

$$DC_{error} = \frac{A^2 K_1 \sqrt{2}}{4\pi V_{LO}}$$

$A$ = Blocker Amplitude
$K_1$ = Coupling Coefficient
$V_{LO}$ = LO Amplitude

However, with preprocessing, the DC error from the RF blocker is:

$$DC_{error} = \frac{A^2 K_2}{4\pi V_{LO} \cdot gain}$$

$K_2$ = Coupling for Lines from Preprocessor to Mixer ($K_2 \ll K_1$)

gain = gain of preprocessor (between 3 and 10 in exemplary embodiment)

By way of example, if gain=3 and estimating $K_2=K_1/30$, it can be seen that preprocessing in this example reduces the $DC_{error}$ term from blockers by more than 40 dB.

8. Second Embodiment of the Preprocessor of the Subject Invention

Figure 12:
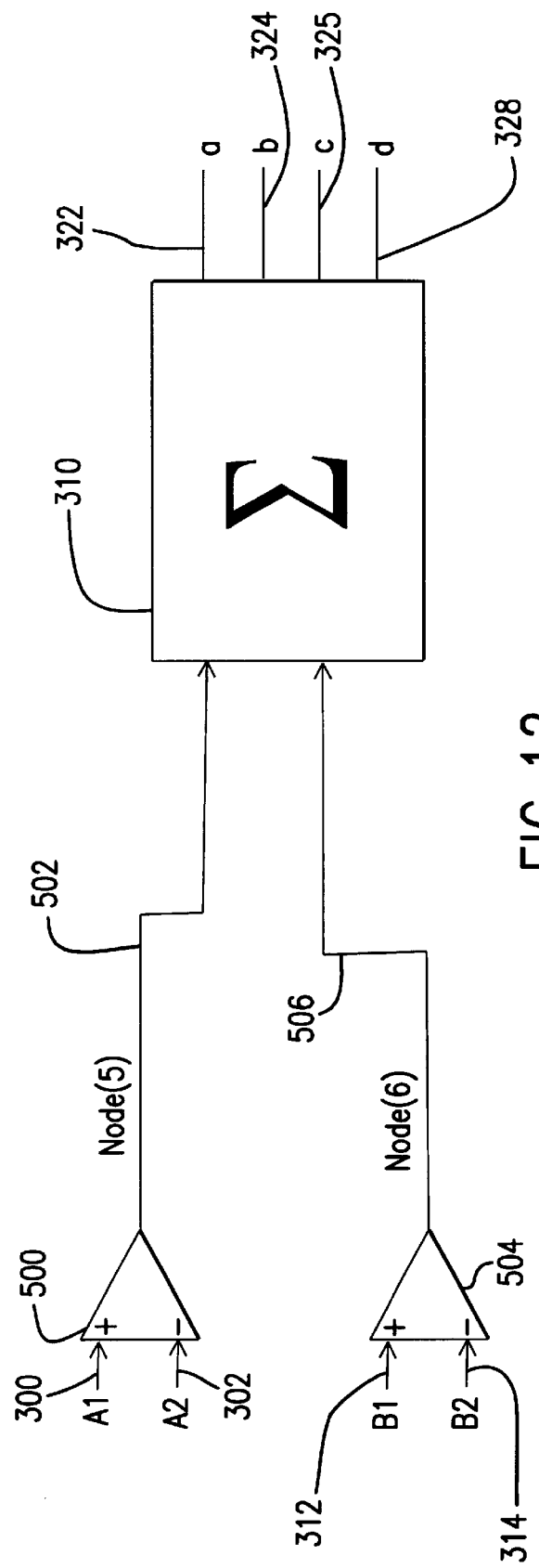
FIG. 12 illustrates a block diagram of a second embodiment of the subject invention.

FIG. 12 illustrates a second embodiment of the subject invention wherein single output comparators 500, 504 replace the dual output comparators of the first embodiment of FIG. 4. In relation to FIG. 4, like elements are referenced with like reference numerals in FIG. 12. As shown, a first single output comparator 500 connects to input A1 300 and input A2 302, and has a single output 502, referred to herein as node(5), connected to summing unit 310. Similarly, second single output comparator 504 connects to input B1 312 and B2 314 and has a single output 506 (node(6)) connected to summing unit 310.

The comparators 500 and 504 operate in accordance with the following equations.

If $A1>A2$ then node(5)=1

If $A1<A2$ then node(5)=0

If $A1=A2$ then node(5)=0

The operation of comparator 504 mirrors operation of first single output comparator 500. The following equations define operation of second comparator 504.

If $B1>B2$ then node (6)=1

If $B1<B2$ then node (6)=0

If $B1=B2$ then node(6)=0

The inputs on node(5) 500 and node(6) 504 are presented to the summing unit 310. The summing unit 310 combines the inputs provided on node(5) and node(6) to generate outputs a 320, output b 324, output c 326 and output d 328. The following equations define operation of summing unit 310.

Output $c$=node(5)+node(6)

Output $a$=node(5)−node(6)

Output $d$=node(6)−node(5)

Output $b$=−(node(5))−node(6)

9. I/O Waveforms For the Second Embodiment of the Preprocessor

TABLE 2, shown below, presents the behavior of the preprocessor configured in accordance with the second embodiment when presented with the signal shown in FIG. 6. Although the second embodiment includes single output comparators, the final output from the summing unit is a generally stair stepped signal having the desirable characteristics of the subject invention, as shown in FIG. 11.

TABLE 2

| Signal Values | Time T1 | Time T2 | Time T3 | Time T4 | Reference Figure |
|---|---|---|---|---|---|
| Input A1 | A1 > A2 | A1 < A2 | A1 < A2 | A1 > A2 | FIG. 6 |
| Input A2 | // | // | // | // | FIG. 6 |
| Input B1 | B1 > B2 | B1 > B2 | B1 < B2 | B1 < B2 | FIG. 6 |
| Input B2 | // | // | // | // | FIG. 6 |
| Node(5) | 1 | 0 | 0 | 1 | NA |
| Node(6) | 1 | 1 | 0 | 0 | NA |
| Output c Node(5 + 6) | 2 | 1 | 0 | 1 | FIG. 11 |
| Output a Node(5 − 6) | 1 | 0 | 1 | 2 | FIG. 11 |
| Output d Node(6 − 5) | 1 | 2 | 1 | 0 | FIG. 11 |
| Output b Node (−5 − 6) | 0 | 1 | 2 | 1 | FIG. 11 |

10. Example Implementation of Preprocessor

Figure 13:
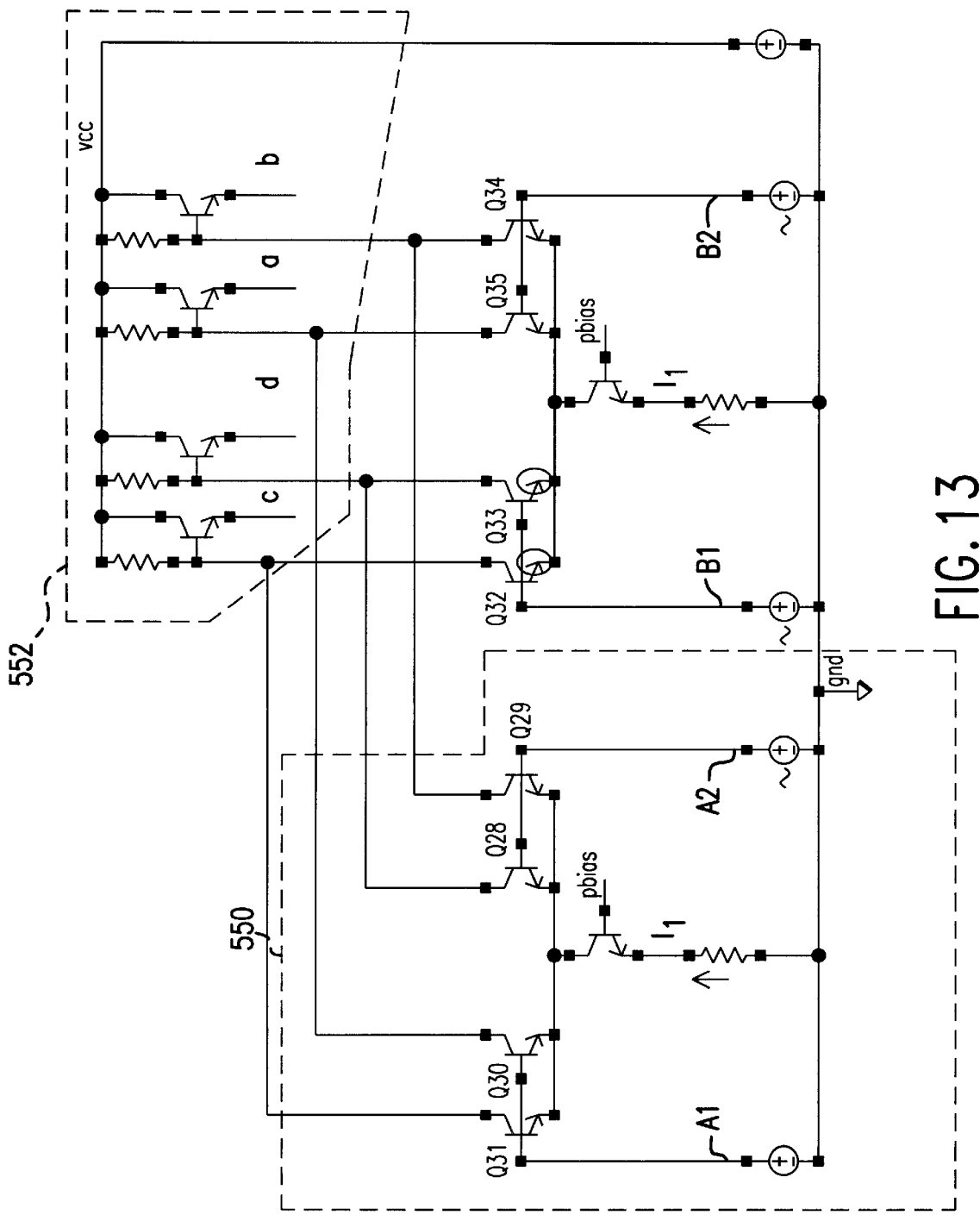
FIG. 13 illustrates an example implementation of the preprocessing circuitry of the subject invention.

FIG. 13 illustrates an example implementation of the preprocessor of the subject invention at circuit level detail. In relation to FIG. 4, like elements are identified with like reference numerals and like reference labels. Points A1, A2, B1, B2 represent inputs to the preprocessor such as from a local oscillator.

The banks of differential pair transistors Q31, Q30, Q28, Q29, Q32, Q33, Q34, Q35 are duplicative on the right and left side and accordingly the operation of differential pair transistors within dashed line 550 is the focus of discussion herein. The connections are as shown in the figure, and accordingly need not be described in detail herein.

The operation of the example implementation shown in FIG. 13 at a time T1 is now discussed. The base of transistors Q31 and Q30 receive input signal 402 (FIG. 6), which is high at time T1, causing Q31 and Q30 to turn on. When transistors Q31 and Q30 are on, current $I_1$ from transistor Q93 flows from emitter to collector through both Q31 and Q30. The paired configuration of Q31 and Q30 divide current $I_1$ causing $I_1/2$ to flow to output c and $I_1/2$ to flow to output a.

Simultaneously, at time T1 when Q31 and Q30 are on, the base of transistors Q28 and Q29 are presented with signal 406 (FIG. 6) from input A2. The value of signal 406 is low at time T1, causing Q28 and Q29 to remain off preventing current flow therethrough. Thus, output d and output b do not receive current from differential pair transistors (enclosed by dashed line 550) at time T1.

At time T1, input B1 receives signal 404 (FIG. 6) which is of greater value than signal 408 thereby causing transistors Q32 and Q33 to turn on and transistors Q35 and Q34 to remain turned off. Hence, current $I_1$ from transistor Q94 is divided between Q32 and Q33 and presented to output c as $I_1/2$ and to output d as $I_1/2$. This yields the following current at output c:

output $c=I_1/2+I_1/2=I_1$ and the following current at output d:

output $d=0+I_1/2=I_1/2$

Likewise, Q35 and Q34 provide zero current to output a and output b to yield the following current at output a:

output $a=I_1/2+0=I_1/2$ and at output b:

output $b=0+0=0$

Figure 14:
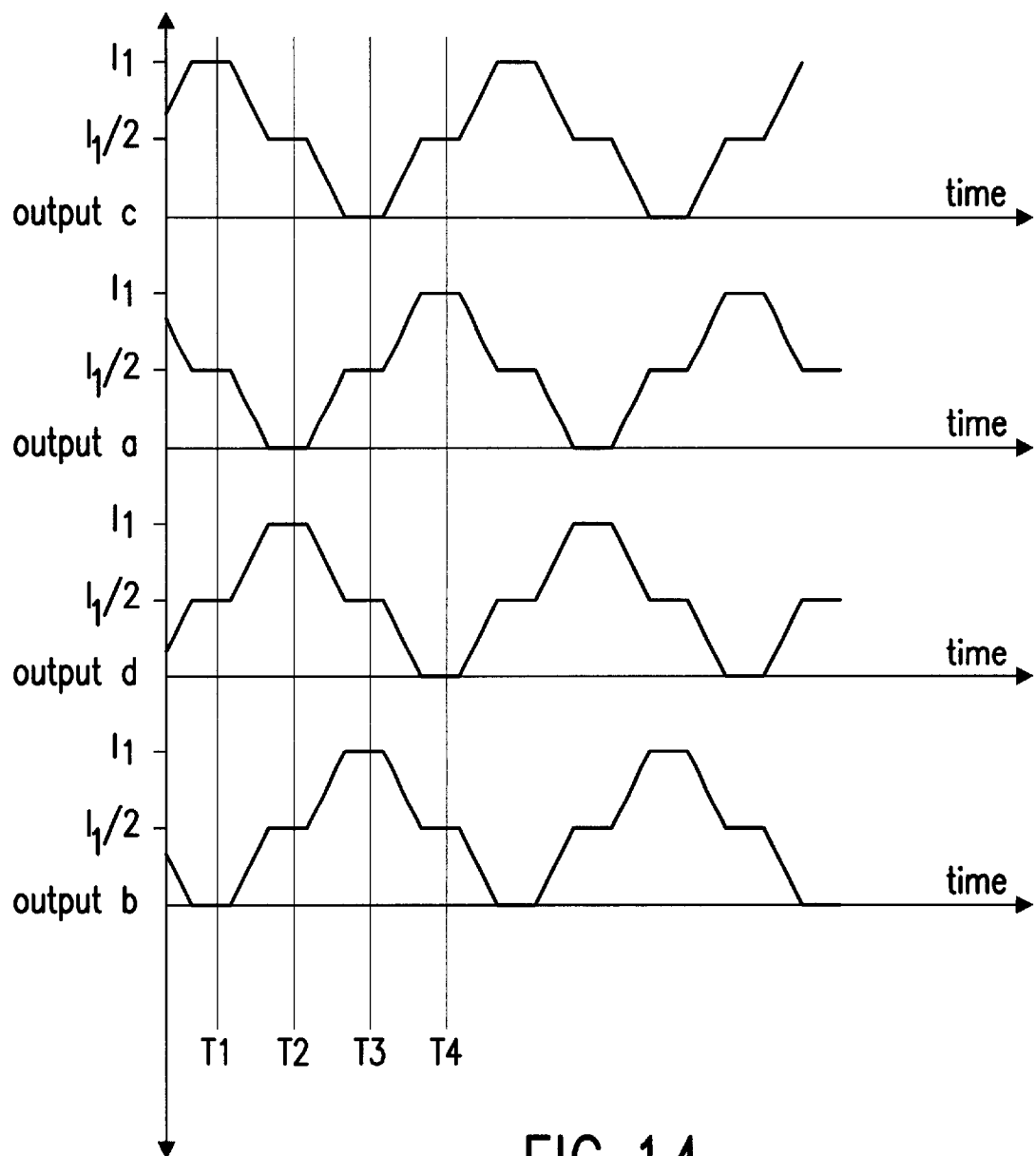
FIG. 14 illustrates a plot of the output signals from the example implementation of the preprocessing circuitry of the subject invention.

FIG. 14 illustrates generally ideal plot of outputs a, b, c, d of the implementation example of FIG. 13. At a time T1, the signal status of each of the outputs a, b, c, d is as shown. In contrast to the ideal circuit response shown in FIG. 11, FIG. 14 includes a greater response time between zero, $I_1/2$ and $I_1$ states of the signal. The non-perfect square waves of FIG. 14 more accurately illustrate the output of the implementation example.

A similar process occurs at and between times T2, T3, and T4 to yield the signals as shown.

11. Buffer Subsystem

FIG. 13 also illustrates a buffer subsystem enclosed within dashed line 552. The buffer subsystem couples outputs a, b, c, d to a voltage source Vcc. In one application, tt also couples these outputs to a mixer or other electronic component. The buffer shown in FIG. 13 causes impedance transformation by adding a high input impedance and a low output impedance to the output stage of the preprocessor to improve mixer and preprocessor performance. Each transistor Q44–Q47 acts as a variable switch to provide a voltage from Vcc at outputs a, b, c, d that is equivalent to the voltage at each transistor base. Resistors R22–R19 in conjunction with Q44–Q47 achieve desired impedance transformation. Buffers and impedance transformation are known by those of ordinary skill in the art and accordingly need not be described further.

12. Additional Preprocessor Implementation Details

FIGS. 24(a)–24(i) illustrate additional details about the operation of the first embodiment of the preprocessor illustrated in FIG. 4. FIG. 24(a) illustrates an example of a split-phase input to the preprocessor from a local oscillator. It represents four sinusoidal signals, A1, A2, B1, and B2, which are 90 degrees out of phase with respect to one another. In this example, B1 is shifted by 90 degrees with respect to A1, A2 is shifted by 180 degrees with respect to A1, and B2 is shifted by 270 degrees with respect to A1.

FIG. 24(b) illustrates the signal which appears at node (1) in the embodiment of FIG. 4 responsive to the inputs of FIG. 24(a). As can be seen, it is a logical "1" when A1>A2, and a logical "0" otherwise.

FIG. 24(c) illustrates the signal which appears at node (2) responsive to the inputs of FIG. 24(a). As can be seen, it is a logical "1" when A2>A1, and a logical "0" otherwise.

FIG. 24(d) illustrates the signal which appears at node (3) responsive to the inputs of FIG. 24(a). As can be seen, it is a logical "1" when B1>B2, and a logical "0" otherwise.

FIG. 24(e) illustrates the signal which appears at node (4) responsive to the inputs of FIG. 24(a). As can be seen, it is a logical "1" when B2>B1, and a logical "0" otherwise.

FIG. 24(f) illustrates the signal "c" which is output from arithmetic unit 310 in FIG. 4. As can be seen, it is the sum of the signals on node (1) and node (3).

FIG. 24(g) illustrates the signal "a" which is output from arithmetic unit 310 in FIG. 4. As can be seen, it is the sum of the signals on node (1) and node (4).

FIG. 24(h) illustrates the signal "d" which is output from arithmetic unit 310 in FIG. 4. As can be seen, it is the sum of the signals on node (2) and node (3).

FIG. 24(i) illustrates the signal "b" which is output from arithmetic unit 310 in FIG. 4. As can be seen, it is the sum of the signals on node (2) and node (4).

If the period of the local oscillator signals of FIG. 24(a) is divided up into four substantially non-overlapping portions as shown in FIG. 24(i), comparing the signals of FIGS. 24(f)–24(i), it will be observed that, in each of these portions, only one of these signals is asserted at a time, that is, only one is in a predefined state sufficient to actuate a mixer to reverse polarity, which in the example shown, is the achievement of the value 2. It will also be observed that, in each of these portions, a different one of these signals is asserted. In the first portion, signal "a" is asserted; in the second portion, the signal "c" is asserted; in the third portion, the signal "d" is asserted; and in the fourth portion, the signal "b" is asserted. It will also be observed that the boundaries between these portions define transitions points, that the signals at these transition points are steep and sharp, and that the transition points are defined by crossover points of the signals through a DC offset.

FIGS. 25(a)–25(g) illustrate additional details about the operation of the second embodiment of the preprocessor illustrated in FIG. 12. FIG. 25(a) illustrates an example of a split-phase input to the preprocessor from a local oscillator. It is identical to FIG. 24(a), and need not be explained further.

FIG. 25(b) illustrates the signal which appears at node (5) in the embodiment of FIG. 12 responsive to the inputs of FIG. 25(a). As can be seen, it is a logical "1" when A1>A2, and a logical "0" otherwise.

FIG. 25(c) illustrates the signal which appears at node (6) responsive to the inputs of FIG. 25(a). As can be seen, it is a logical "1" when A2>A1, and a logical "0" otherwise.

FIG. 25(d) illustrates the signal "c" which is output from arithmetic unit 310 in FIG. 12. As can be seen, it is the sum of the signals on node (5) and node (6).

FIG. 25(e) illustrates the signal "a" which is output from arithmetic unit 310 in FIG. 12. As can be seen, it is the difference between the signals on node (5) and node (6), with a DC offset of +1 added.

FIG. 25(f) illustrates the signal "d" which is output from arithmetic unit 310 in FIG. 12. As can be seen, it is the difference between the signals on node (6) and node (5), again with a DC offset of +1 added.

FIG. 25(g) illustrates the signal "b" which is output from arithmetic unit 310 in FIG. 12. As can be seen, it is the difference between the inverse of the signal on node (5) and the signal on node (6), again with a DC offset of +1 added.

These signals are identical to the signals of FIGS. 24(f)–24(i) and need not be discussed further.

Figure 24:
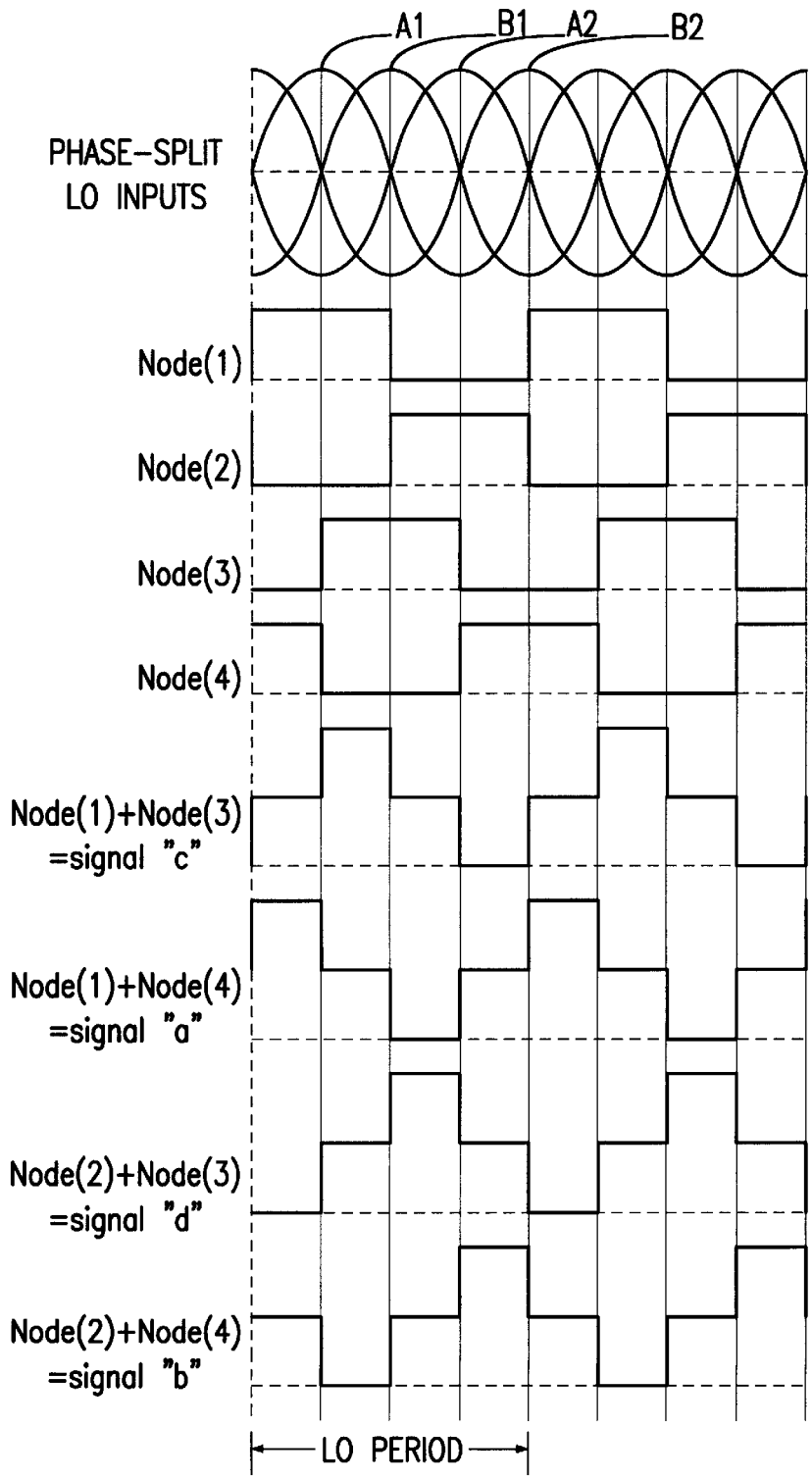
FIGS. 24(a)–24(i) illustrate operation of a first embodiment of a preprocessor configured in accordance with the subject invention.
Figure 25:
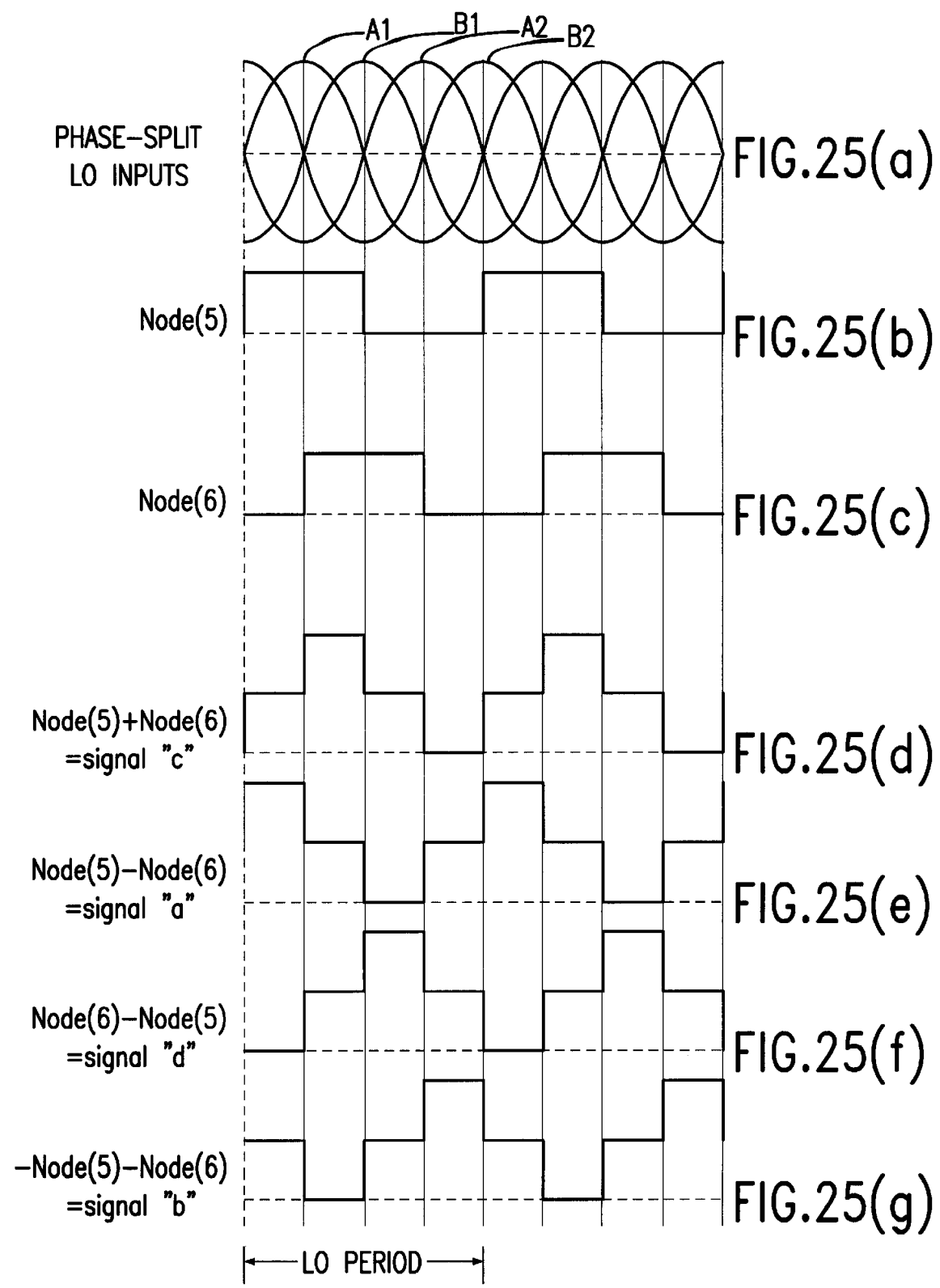
FIGS. 25(a)–25(g) illustrate operation of a second embodiment of a preprocessor configured in accordance with the subject invention.

Generalizing from FIGS. 24 and 25, it can be seen that the examples depicted in these figures can easily be extended to the case in which there are 2n split-phase input signals, where n is an integer. In this case, there will also be 2n output signals. Moreover, if the period of the input signals is divided up into 2n substantially non-overlapping portions, it will be observed that only one of the output signals will be asserted in one of the portions, and that a different one of these signals will be asserted in each portion. In the embodiment of FIG. 24, 2n intermediate signals will be generated, while, in the embodiment of FIG. 25, only n intermediate signals need be generated. In one implementation, the 2n input signals are input into a comparator stage, the intermediate signals output from the comparator stage are input to an arithmetic unit stage, and the 2n signals output from the arithmetic stage comprise the preprocessor outputs.

Figure 26:
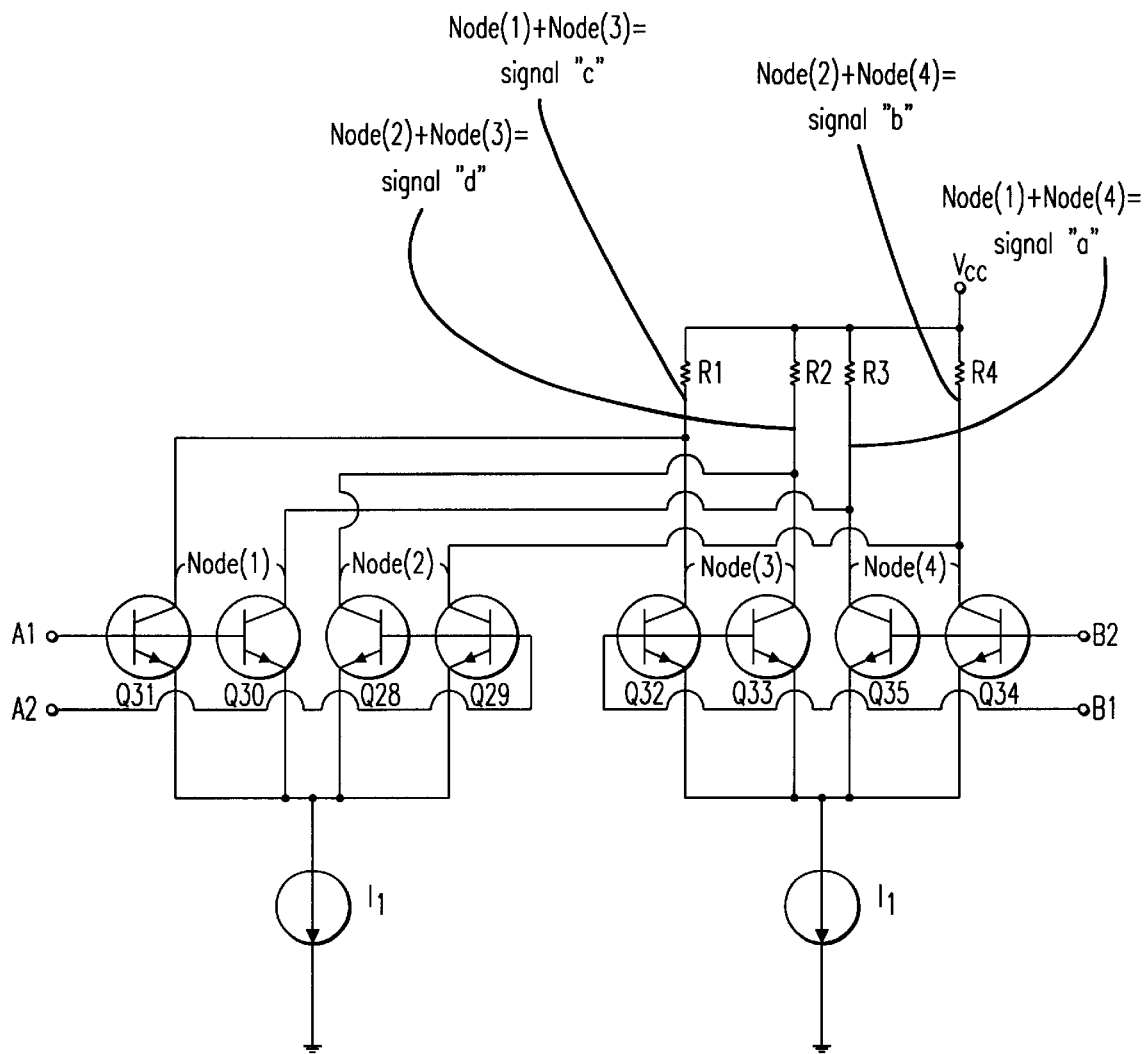
FIG. 26 illustrates an implementation example of a first embodiment of a preprocessor configured in accordance with the subject invention.

FIG. 26 illustrates an implementation example of the first embodiment of FIG. 4. It is similar to but at a higher level of detail that the example of FIG. 13. As can be seen, when signal A1 is greater than A2, Q31 and Q30 will conduct, but Q28 and Q29 will shut off. Otherwise, when signal A2 is greater than A1, Q28 and Q29 will conduct, but Q31 and Q30 will shut off. Similarly, when signal B1 is greater than B2, transistors Q32 and Q33 will conduct, but transistors Q35 and Q34 will shut off. However, when B2 is greater than B1, transistors Q34 and Q35 will conduct, but transistors Q32 and Q33 will be shut off.

The transistors are balanced so that the current $I_1$ from the sources depicted in the bottom of the figure will split into two substantially equal portions, bot equal to about $I_1/2$, which will flow through the two transistors in either half of the circuit that will be conducting at a time. In can also be seen that these currents are added in various combinations in the resistor network at the top of the figure. Signal "a" is defined so that it represents the sum of the currents from nodes (1) and (4); signal "b" is defined so it represents the sum of the currents from nodes (2) and (4); signal "c" is defined so it represents the sum of the current from nodes (1) and (3); and signal "d" is defined so it represents the sum of the current from nodes (2) and (3).

FIGS. 27(a)–27(h) illustrate desirable characteristics of the preprocessor outputs in one embodiment of the invention. Defining in this example achievement of the value 2 as the predefined state which actuates the mixer to reverse polarity, it can be seen that each of these signals achieves this predefined state in one of the four non-overlapping portions of the LO period indicated in the figures, and that only one of the signals is asserted in this predefined state at a time. This is indicated in FIGS. 27(a)–27(d). In addition, it will be observed that the switching points 2000 at which the mixer reverses polarity are defined by DC offset crossover points of the preprocessor outputs. Further, it will be observed that the slope of the signals at these transition points, identified by numerals 2001 and 2002, is sharp and steep.

While particular embodiments of the present invention have been described above, it should be understood that they have been presented by way of example only, and not as limitations. The breadth and scope of the present invention is defined by the following claims and their equivalents, and is not limited by the particular embodiments described herein.

What is claimed is:

1. A circuit comprising:
a first comparator having a first input and a second input and a first output node and a second output node, wherein said first comparator outputs a first value on said first output node and a second value on said second output node if a signal on said first input is greater than a signal on said second input and said first comparator outputs a second value on said first output node and a first value on said second output node if a signal on said first input is less than a signal said second input;
a second comparator having a third input and a fourth input and a third output node and a fourth output node, wherein said second comparator outputs a first value on said third output node and a second value on said fourth output node if a signal on said third input is greater than a signal on said fourth input and said second comparator outputs a second value on said third output node and a first value on said fourth output node if a signal on said third input is less than a signal on said fourth input; and an arithmetic unit connected to said first, second, third, and fourth output nodes and having a fifth output, a sixth output, a seventh output and an eighth output, wherein said arithmetic unit combines signals at said first, second, third and fourth output nodes in the following fashion: the fifth output signal is derived from the first output node signal plus the third output node signal; the sixth output signal is derived from the first node output signal plus the fourth node output signal; the seventh output signal is derived from the second node output signal plus the third node output signal; and the eighth output signal is derived from the second node output signal plus the fourth node output signal.

2. The circuit of claim 1 wherein said first comparator and said second comparator are comprised of at least one differential pair of transistors.

3. The circuit of claim 1 in combination with a frequency translator which comprises a mixer.

4. The circuit of claim 3 in combination with said mixer which comprises a modified Gilbert mixer.

5. A circuit comprising:
a first comparator having a first input and a second input and a first output node, wherein said first comparator outputs a first value on said first output node if a signal on said first input is greater than a signal on said second input, and a second value on said first output node otherwise;
a second comparator having a third input and a fourth input and a second output node, wherein said second comparator outputs a first value on said second output node if a signal on said third input is greater than a signal on said fourth input, and a second value on said second output node otherwise; and
an arithmetic unit connected to said first and second output nodes and having a third output, a fourth output, a fifth output and a sixth output, wherein said arithmetic unit combines signals at said first and second output nodes in the following fashion: the third output signal is derived from the first node output signal plus the third node output signal; the fourth output signal is derived from the first node output signal minus the second node output signal; the fifth output signal is derived from the second node output signal minus the first node output signal; and the sixth output signal is derived from the inverse of the first node output signal minus the second node output signal.

6. A circuit which receives n input signals, wherein n is an integer, each of the input signals having a period comprising n substantially non-overlapping portions, and, responsive thereto, provides n output signals, wherein one and only one of the output signals is asserted in a predefined state in a portion, and a different one of the output signals is asserted in the predefined state in each portion.

7. The circuit of claim 6 in combination with a mixer, wherein the predefined state is determined to actuate a reversal of polarity of the mixer, wherein n is divisible by 2 such that n=2m, wherein m is also an integer, and wherein the mixer is configured to switch polarity at a rate of m times the frequency of the input signals to the circuit.

8. A method for processing a number X of split-phase input signals comprising;
comparing said input signals;
calculating a plurality of intermediate signals based on said comparison of said input signals; and
combining said plurality of intermediate signals to form a number X of output signals, wherein only one of said output signals is in a predefined state at a time.

9. The method of claim 8 wherein X equals four.

10. The method of claim 8 wherein the input signals are 90 degree phase-split signals.

11. The method of claim 8 wherein the comparing step comprises comparing signals that are 180 degrees out of phase.

12. The method of claim 11 further including the step of buffering a number X of output signals.

13. A method of processing four split-phase local oscillator signals to provide four output signals having improved switching characteristics, said method comprising:

setting a first preprocessor output to a predefined state if said first local oscillator output is greater then said second local oscillator output and said third local oscillator output is greater than said fourth local oscillator output;

setting a third preprocessor output to the predefined state if said first local oscillator output is less than said second local oscillator output and said third local oscillator output is greater than said fourth local oscillator output;

setting a fourth preprocessor output to the predefined state if said first local oscillator output is less than said second local oscillator output and said third local oscillator output is less than said fourth local oscillator output; and setting a second preprocessor output to the predefined state if said first local oscillator output is greater than said second local oscillator output and said third local oscillator output is less than said fourth local oscillator output.

14. The method of claim 13 wherein the steps of said method are executed in software code.

15. The method of claim 13 wherein each of said local oscillator outputs is a sinusoidal signal.

16. A direct conversion receive system comprising:

a multiplier having a first input port for receiving a first signal at a first frequency, a second input port for receiving 2n second signals at a second frequency about equal to 1/n times the first frequency, wherein n is an integer, the second signals having a period comprising 2n substantially non-overlapping portions, and an output port, wherein the multiplier is configured to provide to the output port an output signal representative of the product of the first signal and a multiplication factor which is switched at n times the second frequency, the output signal having a baseband component and another component;

an oscillator circuit for providing at least one oscillator signal;

a preprocessor coupled to the oscillator circuit and, responsive to receipt of the at least one oscillator signal, providing the 2n second signals at the second frequency such that, during each of the 2n portions of the period of the second signals, only one of the second signals is asserted in a predefined state determined effective to actuate the multiplier to switch polarity; and a filter coupled to the output port of the multiplier and configured to substantially filter out the other component, and maintain the baseband component in the output signal.

17. The system of claim 16 wherein n is 2.

18. The system of claim 16 wherein the first signal is an RF signal.

19. The system of claim 16 wherein the multiplier is a mixer.

20. The system of claim 18 wherein the RF signal is a baseband signal modulated onto an RF carrier signal.

21. The system of claim 19 wherein the mixer has differential inputs and outputs.

22. The system of claim 21 wherein the mixer comprises a current steering mixer core and an output, wherein the current steering core comprises a plurality of switches configured, responsive to the 2n second signals, to provide to the output, during n portions of the 2n portions of the period of the second signals, a signal derived from the first signal, and to provide to the output, during the other n portions of the 2n portions of the period of the second signals, the inverse of the signal derived from the first signal.

23. A direct conversion receiver system comprising:

first means for receiving a first signal at a first frequency, and 2n second signals at a second frequency about equal to 1/n times the first frequency, wherein n is an integer, the second signals having a period having 2n substantially non-overlapping portions, and outputting a signal representative of the product of the first signal and a multiplication factor which is switched at n times the second frequency, the output signal having a baseband component and another component;

second means for providing at least one oscillator signal;

third means, responsive to receipt of the at least one oscillator signal, for providing the 2n second signals at the second frequency such that, during each of the 2n portions of the period of the second signals, only one of the second signals is asserted in a predefined state determined to actuate the multiplier to switch polarity; and fourth means configured to substantially filter out the other component, and maintain the baseband component, in the output signal.

24. A method for performing direct conversion of a first signal comprising:

providing the first signal at a first frequency;

providing 2n second signals at a second frequency about equal to 1/n times the first frequency, wherein n is an integer, the second signals having a period comprising 2n substantially non-overlapping portions, such that, during each of the 2n portions of the period of the second signals, only one of the second signals is asserted in a predefined state;

providing, responsive to the 2n second signals, an output signal representative of the product of the first signal and a multiplication factor which is switched at n times the second frequency, the output signal having a baseband component and another component; and filtering the output signal to substantially remove the other component, and maintain in the output signal the baseband component.

25. The method of claim 24 further comprising providing, responsive to the 2n second signals, to the output, during n portions of the 2n portions of the period of the second signals, a signal derived from the first signal, and to provide to the output, during the other n portions of the 2n portions of the period of the second signals, the inverse of the signal derived from the first signal.

* * * * *